US012074599B2

(12) United States Patent
Brewer

(10) Patent No.: US 12,074,599 B2
(45) Date of Patent: Aug. 27, 2024

(54) 3D STACKED INTEGRATED CIRCUITS HAVING FAILURE MANAGEMENT

(71) Applicant: Micron Technology, Inc., Boise, ID (US)

(72) Inventor: Tony M. Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 17/349,136

(22) Filed: Jun. 16, 2021

(65) Prior Publication Data

US 2021/0313990 A1 Oct. 7, 2021

Related U.S. Application Data

(63) Continuation of application No. 16/846,597, filed on Apr. 13, 2020, now Pat. No. 11,043,952, which is a continuation of application No. 16/218,889, filed on Dec. 13, 2018, now Pat. No. 10,666,264.

(51) Int. Cl.

| H03K 19/17756 | (2020.01) |
| G11C 16/04 | (2006.01) |
| H01L 27/06 | (2006.01) |
| H03K 17/687 | (2006.01) |
| H03K 19/0948 | (2006.01) |
| H03K 19/17704 | (2020.01) |
| H03K 19/17764 | (2020.01) |
| H10B 41/40 | (2023.01) |
| H10B 63/00 | (2023.01) |

(52) U.S. Cl.
CPC ... *H03K 19/17756* (2013.01); *G11C 16/0483* (2013.01); *H01L 27/0688* (2013.01); *H03K 17/687* (2013.01); *H03K 19/0948* (2013.01); *H03K 19/17704* (2013.01); *H03K 19/17764* (2013.01); *H10B 41/40* (2023.02); *H10B 63/30* (2023.02)

(58) Field of Classification Search
None
See application file for complete search history.

(56) References Cited

U.S. PATENT DOCUMENTS

| 6,055,205 A * | 4/2000 | Rao | G11C 16/08 |
| | | | 365/104 |
| 7,216,277 B1 * | 5/2007 | Ngai | G11C 29/846 |
| | | | 714/733 |
| 9,263,152 B1 | 2/2016 | Hoefler et al. | |
| 9,886,275 B1 * | 2/2018 | Carlson | G06F 13/00 |

(Continued)

OTHER PUBLICATIONS

International Search Report and Written Opinion, PCT/US2019/056810, mailed Feb. 5, 2020.

*Primary Examiner* — Crystal L Hammond
(74) *Attorney, Agent, or Firm* — Greenberg Traurig

(57) ABSTRACT

A three-dimensional stacked integrated circuit (3D SIC) having a non-volatile memory die, a volatile memory die, and a logic die. The non-volatile memory die, the volatile memory die, and the logic die are stacked. The 3D SIC is partitioned into a plurality of columns that are perpendicular to each of the stacked dies. Each column of the plurality of columns is configurable to be bypassed via configurable routes. When the configurable routes are used, functionality of a failing part of the column is re-routed to a corresponding effective part of a neighboring column.

29 Claims, 11 Drawing Sheets

(56) References Cited

U.S. PATENT DOCUMENTS

| | | |
|---|---|---|
| 10,152,262 B2 | 12/2018 | Qawami et al. |
| 10,461,076 B1 | 10/2019 | Brewer |
| 10,666,264 B1 | 5/2020 | Brewer |
| 10,840,240 B2 | 11/2020 | Brewer |
| 11,043,952 B2 | 6/2021 | Brewer |
| 2007/0014165 A1* | 1/2007 | Cohen .................. G11C 29/808 365/200 |
| 2007/0291535 A1 | 12/2007 | Eberle et al. |
| 2009/0091333 A1 | 4/2009 | Chung et al. |
| 2009/0147598 A1 | 6/2009 | Norman |
| 2009/0282308 A1 | 11/2009 | Gutsche et al. |
| 2010/0182042 A1* | 7/2010 | Law ................. H03K 19/17796 326/38 |
| 2010/0199017 A1 | 8/2010 | Hollis |
| 2013/0007544 A1* | 1/2013 | Nemazie .............. G11C 29/808 714/E11.024 |
| 2013/0070547 A1* | 3/2013 | Pyeon .................... G11C 29/44 365/200 |
| 2013/0227344 A1 | 8/2013 | Sohn et al. |
| 2013/0265067 A1 | 10/2013 | Leedy |
| 2014/0136903 A1 | 5/2014 | Hyde et al. |
| 2014/0177626 A1 | 6/2014 | Thottethodi et al. |
| 2014/0376320 A1 | 12/2014 | Loh et al. |
| 2015/0162311 A1* | 6/2015 | Bartley ................. G06F 1/3287 327/565 |
| 2015/0194224 A1 | 7/2015 | Jeddeloh |
| 2015/0206573 A1 | 7/2015 | Ryu et al. |
| 2017/0140821 A1 | 5/2017 | Mazed |
| 2017/0322749 A1 | 11/2017 | Qawami et al. |
| 2017/0351570 A1 | 12/2017 | Laity et al. |
| 2018/0096735 A1* | 4/2018 | Pappu .................... G11C 29/14 |
| 2018/0096971 A1 | 4/2018 | Pappu et al. |
| 2018/0190353 A1* | 7/2018 | Srinivasan ........... G11C 13/004 |
| 2019/0004729 A1 | 1/2019 | Qawami et al. |
| 2020/0135719 A1 | 4/2020 | Brewer |
| 2020/0195252 A1 | 6/2020 | Brewer |
| 2020/0244268 A1 | 7/2020 | Brewer |
| 2021/0050347 A1 | 2/2021 | Brewer |

\* cited by examiner

3D STACKED INTEGRATED CIRCUITS HAVING FAILURE MANAGEMENT

RELATED APPLICATION

The present application is a continuation application of U.S. patent application Ser. No. 16/846,597, filed Apr. 13, 2020, issued as U.S. Pat. No. 11,043,952 on Jun. 22, 2021, which is a continuation application of U.S. patent application Ser. No. 16/218,889, filed Dec. 13, 2018, issued as U.S. Pat. No. 10,666,264 on May 26, 2020, both entitled "3D STACKED INTEGRATED CIRCUITS HAVING FAILURE MANAGEMENT," the entire disclosures of which applications are hereby incorporated herein by reference.

FIELD OF THE TECHNOLOGY

At least some embodiments disclosed herein relate to functional blocks implemented or supported by three-dimensional integrated circuits (3D ICs) in general, and more particularly, but not limited to, three-dimensional stacked integrated circuits (3D SICs) having failure management including configurable routes.

BACKGROUND

Electronic components can fail for many different reasons; therefore, components can benefit from failure management. Failures can be caused by excess temperature, excess voltage, ionizing radiation, mechanical shock or stress, and many other causes. For example, in semiconductor devices, problems in the device package may cause failures such as contamination, mechanical stress, or short circuits. Often, failures occur near the beginning or ending of the lifetime of a device. Also, in semiconductor devices, parasitic structures can be a source of failures such as delays. For example, dysfunctional vias can be a common source of unwanted serial resistance on chips and can cause propagation delays. In general, semiconductor failures are often electrothermal. Locally increased temperatures can lead to immediate failure by melting metallisation layers or the semiconductor, or by changing structures of the semiconductor. As it is apparent, electronic components can fail for many different reasons; and consequently, limit the life of a component. Thus, it is advantageous to include failure management in electronic components.

A 3D IC is an integrated circuit built by stacking silicon dies and interconnecting them vertically so that a combination of the dies is a single device. With a 3D IC, electrical paths through the device can be shortened by its vertical layout, which creates a device that can be faster and has a smaller footprint than similar ICs arranged side-by-side. 3D ICs can be generally grouped into 3D SICs, which refers to stacked ICs with through-silicon via interconnects (TSVs), and monolithic 3D ICs, which are generated using fabrication processes to realize 3D interconnects at the local levels of the on-chip wiring hierarchy as set forth by the International Technology Roadmap for Semiconductors (ITRS). Using the fabrication processes to realize the 3D interconnects can produce direct vertical interconnects between device layers. Monolithic 3D ICs are built in layers on a single wafer that is diced into separate 3D ICs.

3D SICs can be produced by three known general methods: a die-to-die, die-to-wafer, or a wafer-to-wafer method. In a die-to-die method, electronic components are generated on multiple dies. Then, the dies are aligned and bonded. A benefit of a die-to-die method is that each die can be tested before aligned and bonded with another die. In a die-to-wafer method, electronic components are generated on multiple wafers. One of the wafers can be diced and then aligned and bonded on to die sites of another wafer, accordingly. In a wafer-to-wafer method, electronic components are generated on multiple wafers, which are then aligned, bonded, and diced into separate 3D ICs.

A TSV is a vertical electrical connection that can pass through a die. TSVs can be a central part to increasing performance in 3D packages and 3D ICs. With TSVs, compared to alternatives for connecting stacked chips, the interconnect and device density can be substantially higher, and the length of the connections can be shorter.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
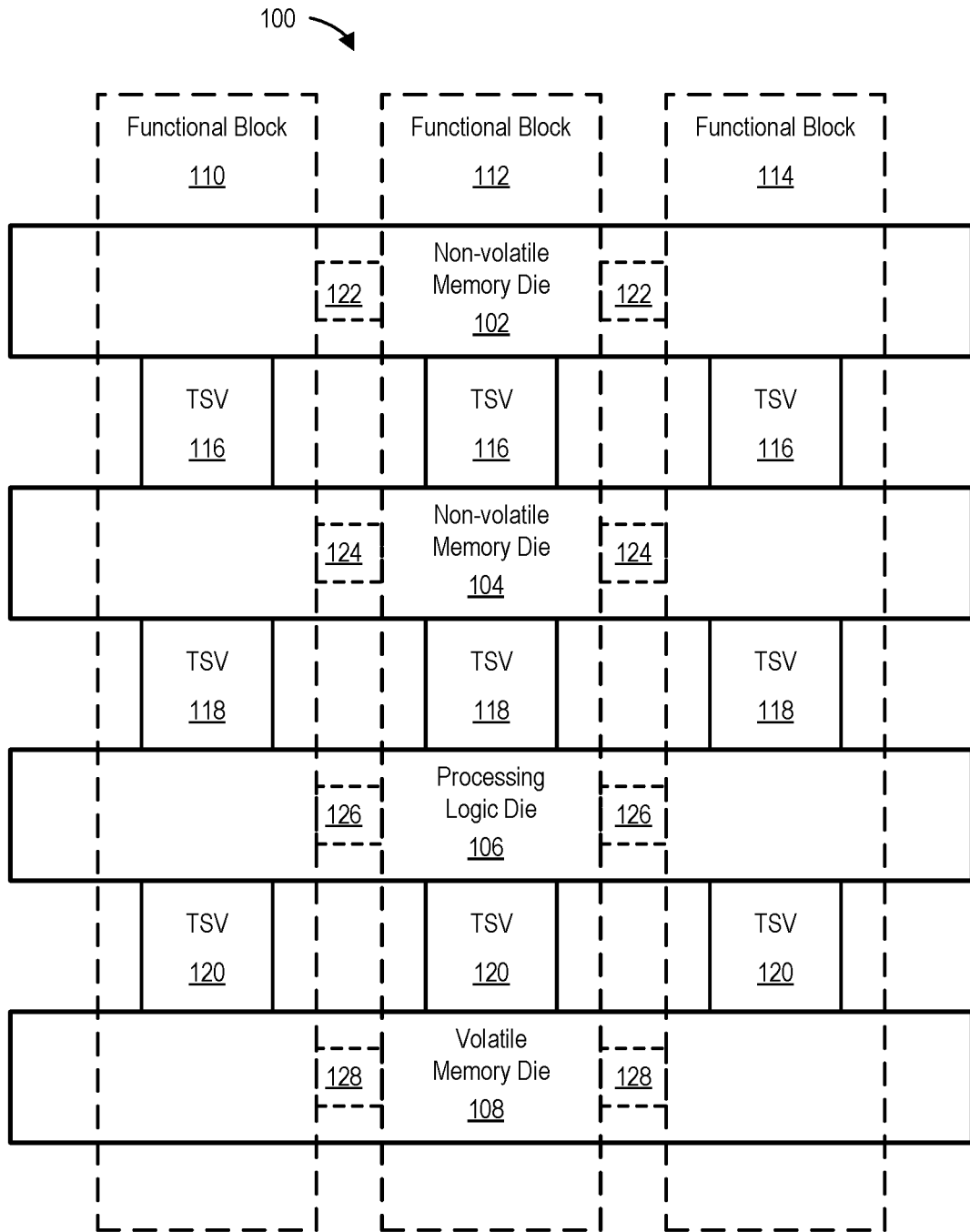
FIG. 1 illustrates a front view of an example 3D SIC having multiple non-volatile memory dies, a volatile memory die, and a processing logic die in accordance with some embodiments of the present disclosure.

At least some aspects of the present disclosure are directed to functional blocks implemented by a 3D SIC. Also, in general, aspects of the present disclosure are directed to functional blocks implemented by a 3D IC.

In general, a 3D IC is an integrated circuit manufactured by stacking silicon wafers or dies and interconnecting them using, for instance, TSVs or Cu-Cu connections, so that they behave as a single device to achieve performance improvements at reduced power and a smaller footprint than conventional two-dimensional devices.

In some embodiments, TSVs can be used, which makes the 3D ICs embodiments that are considered 3D SICs. Embodiments as 3D ICs or as 3D SICs can be created to be heterogeneous, e.g. combining different memory type layers and/or one or more processing layers into a single IC stack. Alternative embodiments of 3D SICs can include monolithic 3D ICs.

Embodiments using monolithic 3D ICs are created in layers on a single semiconductor wafer that is then diced into 3D ICs. These embodiments are advantageous in that there is no need for aligning, thinning, bonding, or TSVs. Although the disclosure herein is mostly focused on 3D SIC embodiments, it is to be understood that the embodiments disclosed herein are not limited to 3D SIC embodiments. Some embodiments can be a monolithic 3D IC instead of a 3D SIC. In such example embodiments, the overall structure of the 3D IC can be similar; however, the interconnects of a monolithic 3D IC includes fabricated vias instead of TSVs.

As for producing 3D SIC embodiments, such embodiments can be generated by a die-to-die, a die-to-wafer, or a wafer-to-wafer production method. In a die-to-die method, thinning and TSV creation can be done before or after bonding in the production method. An example advantage of die-to-die methods is that each component die can be tested before stacking it with other dies. Also, each die can be separately binned for production. In a die-to-wafer method, similar to a wafer-to-wafer method, thinning and TSV creation are performed either before or after bonding. But, an advantage of die-to-wafer over wafer-to-wafer is that additional dies can be added to a stack before dicing, and a die can be tested before adding it to a wafer. In wafer-to-wafer, each wafer can be thinned before or after bonding, and connections are either built into the wafers before bonding or else created in the stack after bonding. With wafer-to-wafer methods, the TSVs can pass through the silicon substrates between active layers and/or between an active layer and an external bond pad. A disadvantage of a wafer-to-wafer method is that a defect in one chip causes a defect in the entire stacked output of the method.

Chip scaling processes are slowly improving in-part because of power-density constraints and interconnects are not becoming faster while transistors are becoming faster in general. 3D ICs address both of these example scaling problems by stacking two-dimensional dies and connecting the dies in a third dimension. Such stacking can possibly make communications between chips faster, compared to a horizontal arrangement of ICs. Also, 3D ICs can provide other possible benefits over horizontally arranging chips, including: a smaller footprint, shorter interconnects, reduced power consumption, circuit security through obscurity, and increased bandwidth.

3D ICs provide greater functionality into a smaller two-dimensional space by taking advantage of adding functionality in layers of a third dimension, and costs can be saved by partitioning a large chip into multiple smaller dies with 3D stacking. To put it another way, the 3D IC manufacturing can be more modular than conventional processes of producing a chip with an array of ICs. Also, 3D ICs can be generated with layers that are created with different processes or different types of wafers, which increases design options. Also, increased connectivity expands design options.

Another advantage is that 3D ICs reduce power consumption by keeping a signal within the device. Shorter electrical connections in two different directions (e.g., horizontally and vertically) also reduce power consumption by producing less parasitic capacitance for example. Reducing the power budget also leads to less heat generation.

Also, 3D ICs can achieve security through obscurity because the stacked die structure complicates attempts to reverse engineer the overall circuitry. Also, sensitive or critical functions can be divided amongst layers of the 3D IC to further conceal such functions. Some embodiments can even have a layer or die dedicated to monitoring or security of the other layers. This is analogous to a firewall layer, where a separate die of the 3D IC provides a hardware firewall for dies to be monitored at runtime. This can be done to protect parts or the entire stack of chips against attacks.

The fundamental structural arrangement of 3D ICs increases bandwidth by allowing large numbers of vias between the dies or layers that in combination can provide much more bandwidth than a conventional bus. Additionally, a set of functional blocks of the 3D SIC can act like a group of separate computers that are networked or clustered. Different functional blocks can have different types of processing units. And, the different types of functional blocks can be complimentary. And, the more related a functional block is to another block the more beneficial it is to locate two functional blocks next to each other. For example, a first block can provide a first data processing operation and a neighboring second block can provide a second data processing operation in a common multiple operation data processing method. Such features can greatly reduce the load of a controller of computerized system. For instance, such features can reduce the load of a central processing unit (CPU).

In embodiments where the blocks are implemented by a 3D SIC, the use of TSVs can make it advantageous to reduce each functional block to one function so that the benefits of TSVs are fully realized. In such embodiments, the functionality of the 3D IC can be increased by increasing the number of functional blocks in the 3D IC and not the number of functions that a single functional block can perform. This way, the TSV or another type of interconnect of a 3D SIC can be used to its full potential.

A TSV is an electrical connection that can pass completely through a silicon wafer or die. With TSVs, interconnections and device density is substantially higher than with conventional interconnections between die. And, length of the connections between die is shorter than conventional interconnections.

Some embodiments can have TSVs added to the 3D IC structure via-first TSV fabrication. This is a process where the TSVs are fabricated before the components, e.g., transistors, capacitors, and resistors, are patterned onto the wafer. Some embodiments use via-middle TSV fabrication where TSVs are fabricated after the individual devices are patterned but before the metal layers are added to a die or a stack of dies. And, some embodiments use via-last TSV fabrication where TSVs are fabricated after or during the addition of metal layers.

In addition to the way in which TSVs are added to the 3D IC, the layout and design of the TSVs can vary between embodiments described herein. For example, differences in partitioning granularity of functional elements of the dies of the 3D IC can cause variation in the design and layout of TSVs. Some embodiments have gate level partitioning using TSVs and other embodiments have block level partitioning. Gate level partitioning using TSVs is less practical than block level partitioning; thus, to increase the benefit of having more TSVs, functional sub-elements partitioned within a functional block can be connected via TSVs. This can be a middle ground solution.

In some embodiments, a stack of chips or die (stacked in a first direction) can have a processing logic integrated circuit (IC), in addition to memory ICs, such as 3D XPoint memory (3DXP) and dynamic random access memory (DRAM) ICs. Units of processing logic, 3DXP and DRAM can be connected to form a functional block, such as by TSVs. Different functional blocks can be configured differently on demand and/or operate substantially independently from each other in one 3D SIC or, in general, in one 3D IC. The processing logic implements frequently used functions and/or data intensive functions, such that even though the processing logic IC may not have the processing power of a CPU, its advantage in better data access can provide a better overall performance in implementing selected functions. Multiple functional blocks (e.g., multiple column functional blocks within a 3D SIC or 3D IC) can run in parallel and reduce the computation load on the CPU.

As mentioned, in some embodiments, the processing logic IC or die does not have a full array of processing cores that a typical CPU would have. But, in such embodiments, the processing logic implements frequently used functions and/or data intensive functions; thus, having potential to relieve the CPU of significant processing duties and enhancing the performance of the CPU. In such embodiments, a functional block cannot execute a complete set of multi-functional instructions on its own. Therefore, the functional block and the remainder of the 3D IC can be connected to a CPU, and the CPU can instruct the function block to do a task it is configured to do. For example, a functional block of example embodiments can be configured to decrypt, by its processing logic IC, the data stored in its non-volatile memory IC, and insert the decrypted data into its volatile memory to be communicated to the CPU for further processing by CPU. Also, the CPU can provide a request to the volatile memory of a functional block to request the block to generate a result of a certain function, and the CPU can also provide a follow-up request to retrieve the result from the functional block. For instance, the request for generation of the result can be provided from the CPU to the functional block in the form of a write command, and the request to retrieve the result can be provided from the CPU to the functional block in the form of a read command.

FIG. 1 illustrates a front view of a 3D SIC 100 having multiple non-volatile memory dies 102 and 104, a volatile memory die 108, and a processing logic die 106 in accordance with some embodiments of the present disclosure. As shown, the dies are parallel to each other. The 3D SIC 100 also has functional blocks 110, 112, and 114 (as shown in FIG. 1) as well as functional blocks 210, 212, 214, 220, 222, and 224 (as shown in FIGS. 2-5) that traverse and are perpendicular to the multiple non-volatile memory dies 102 and 104, the volatile memory die 108, and the processing logic die 106. The 3D SIC 100 also has TSVs 116, TSVs 118, and TSVs 120 that connect the dies respectively. TSVs 116 are shown in between and connecting the non-volatile memory die 102 to the non-volatile memory die 104. TSVs 118 are shown in between and connecting the non-volatile memory die 104 to the processing logic die 106. TSVs 120 are shown in between and connecting the processing logic die 106 to the volatile memory die 108. It is to be understood that all the TSVs described herein pass through the dies described herein even thought this may not be clear from the drawings. For example, TSVs 116, TSVs 118, and TSVs 120 are parts of single TSVs passing through the dies of the 3D SIC 100, wherein each of the single TSVs passing through the dies are perpendicular to the dies.

The 3D SIC 100 also has interconnects 122, 124, 126, and 128, which are shown as embedded in the dies respectively. Interconnects 122 are shown embedded in the non-volatile memory dies 102. Interconnects 124 are shown embedded in the non-volatile memory dies 104. Interconnects 126 are shown embedded in the processing logic die 106. And, interconnects 128 are shown embedded in the volatile memory die 108. The interconnects 122, 124, 126, and 128 can be perpendicular to the TSVs 116, 118, and 120 (as shown in FIG. 1 and as shown partially in FIG. 5).

It is to be understood that interconnects described herein, such as interconnects 122, 124, 126, and 128, refer to interconnections between components of a chip or die (e.g., copper or metal interconnects, interconnect traces, etc.). The interconnects can include interconnects in the metallization layer of a die or chip.

As depicted, in some embodiments, a 3D SIC can have multiple non-volatile memory dies. In some embodiments, the non-volatile memory dies are slower than the volatile memory dies. Specifically, the non-volatile memory dies have less bandwidth (e.g., the maximum amount of data the die can transfer each second) than the volatile memory dies. The non-volatile memory dies can include 3DXP dies or any other type of electrically addressed memory system die, e.g., a EPROM die, flash memory die, ferroelectric RAM, and magnetoresistive RAM. Each non-volatile memory die can have an array of non-volatile memory partitions. Each partition of the array of non-volatile memory partitions can include an array of non-volatile memory cells and each cell can have a corresponding address.

Figure 2:
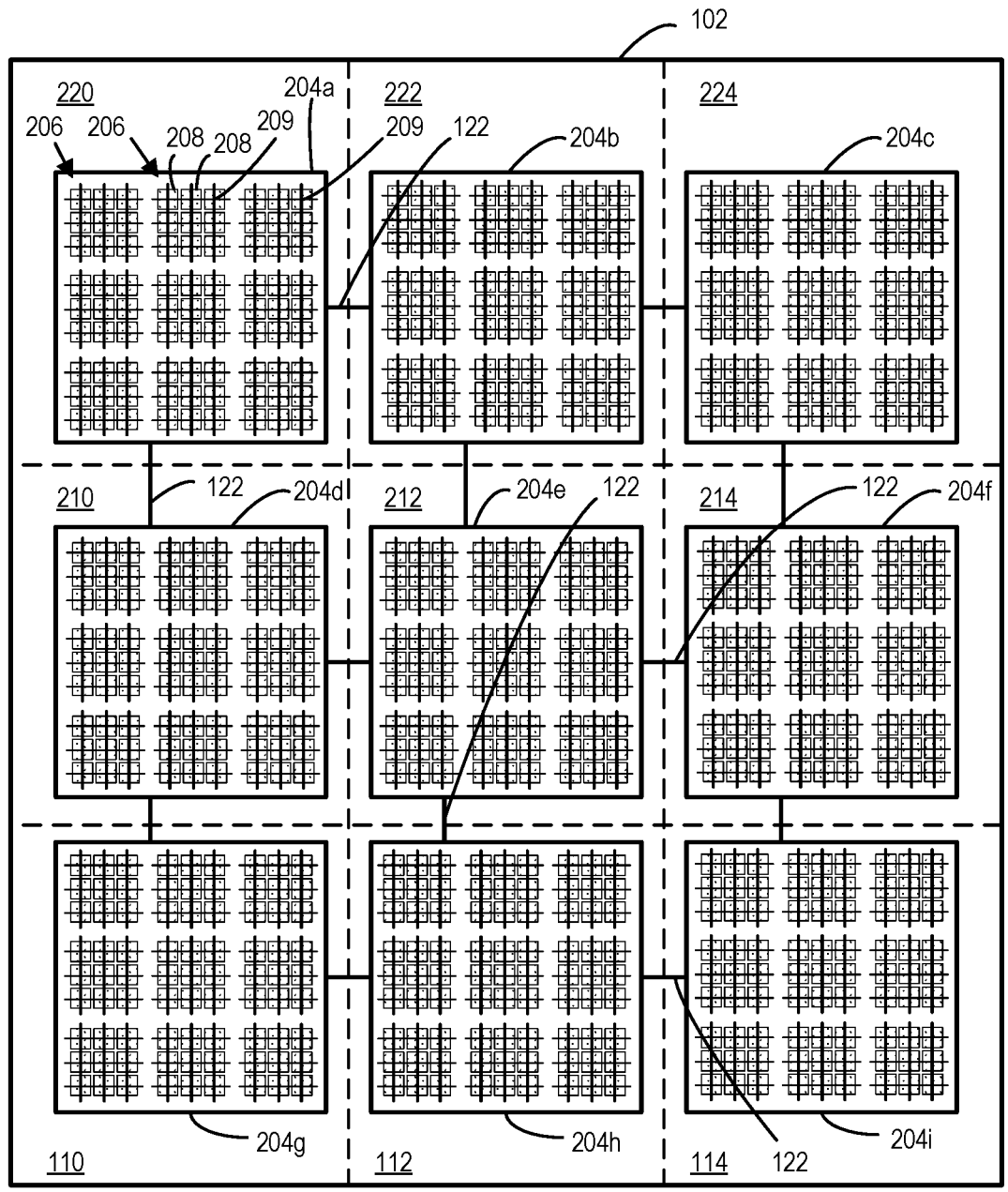
FIG. 2 illustrates a top view of an example non-volatile memory die having multiple non-volatile memory partitions (each partition having multiple non-volatile memory elements) in accordance with some embodiments of the present disclosure.

FIG. 2 illustrates a top view of the non-volatile memory die 102 having multiple non-volatile memory partitions 204a, 204b, 204c, 204d, 204e, 204f, 204g, 204h, and 204i in accordance with some embodiments of the present disclosure. The partitions can be arranged in a second direction (i.e., perpendicular to the first direction of the stacking of the dies of the 3D IC). Each of the partitions 204a, 204b, 204c, 204d, 204e, 204f, 204g, 204h, and 204i has multiple non-volatile memory elements. Each of the partitions illustrated in FIG. 2 shows nine non-volatile memory element clusters 206. And, each of the non-volatile memory element clusters 206 shows nine non-volatile memory elements 208. Thus, each of the partitions illustrated in FIG. 2 has eighty-one memory elements 208. However, it is to be understood that the depiction of eighty-one memory elements is for convenience sake and that in some embodiments each partition could have up to at least a billion memory elements. To put it another way, the number of memory elements per non-volatile memory partition can be enormous and vary greatly. Also, it is to be understood that non-volatile memory die 102 and non-volatile memory die 104 are similar or exactly the same with respect to structure and design.

A 3DXP IC (also known as a 3D XPoint memory IC) uses transistor-less memory elements, each of which has a memory cell and a corresponding address (as well as an optional selector and the cell and optional selector can be stacked together as a column). In examples with memory elements, the memory elements can be connected via two perpendicular layers of interconnects (as shown but not labeled in FIG. 2), where one layer is above the memory elements and the other layer is below the memory elements. Each memory element can be individually selected at a cross point of one wire on each of the two layers of interconnects (e.g., see cross point 209 shown in FIG. 2). Each cross point has an address or is addressable or selectable such as by an address decoder of the 3DXP IC, the 3D IC, or a group of ICs of the 3D IC. 3DXP devices are fast and non-volatile and can be used as a unified memory pool for processing and storage.

As mentioned, the non-volatile memory dies 102 and 104 can be 3DXP dies. Some advantages of using a 3DXP die as the non-volatile memory die of the 3D SIC 100 include that it is bit addressable by an address decoder. An address decoder (not shown in the drawings) used with an embodiment described herein can be a binary decoder that has two or more inputs for address bits and one or more outputs for device selection signals. When the address for a particular device or IC appears on the address inputs, the decoder asserts the selection output for that device or IC. A dedicated, single-output address decoder can be incorporated into each device or IC on an address bus, or a single address decoder can serve multiple devices or ICs.

Also, the 3D SIC can have a volatile memory die (such as a DRAM die or a static random access memory (SRAM) die) including an array of volatile memory partitions. Each partition of the array of volatile memory partitions can include an array of volatile memory cells and each cell can have a corresponding address.

Figure 3:
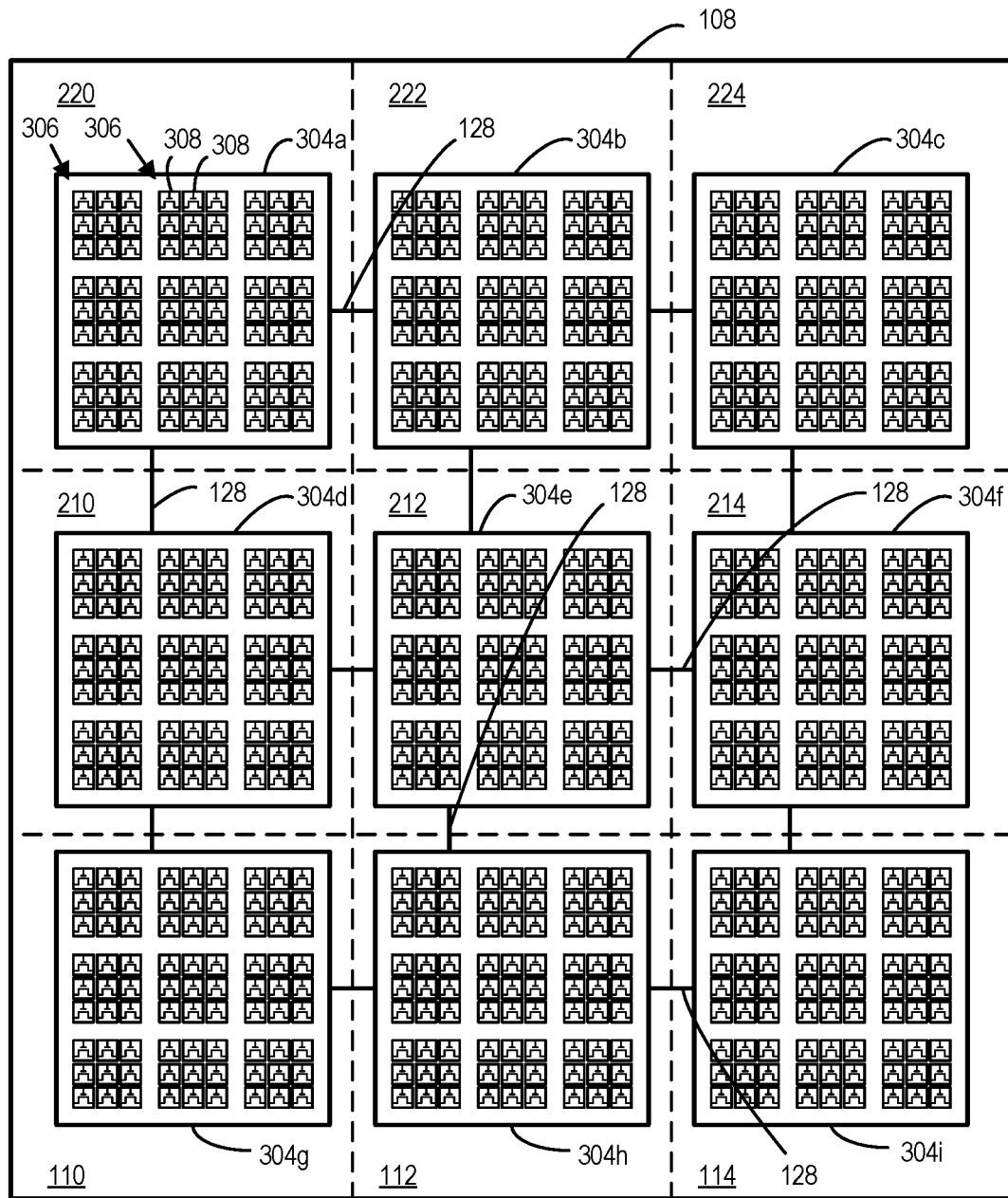
FIG. 3 illustrates a top view of an example volatile memory die having multiple volatile memory partitions (each partition having multiple volatile memory elements) in accordance with some embodiments of the present disclosure.

FIG. 3 illustrates a top view of the volatile memory die 108 having multiple volatile memory partitions 304a, 304b, 304c, 304d, 304e, 304f, 304g, 304h, and 304i in accordance with some embodiments of the present disclosure. The partitions can be arranged in second direction (i.e., perpendicular to the direction of the stacking of the dies of the 3D IC). Each of the partitions 304a, 304b, 304c, 304d, 304e, 304f, 304g, 304h, and 304i has multiple volatile memory elements. Each of the partitions illustrated in FIG. 3 shows nine volatile memory element clusters 306. And, each of the volatile memory element clusters 306 shows nine volatile memory elements 308. Thus, each of the partitions illustrated in FIG. 3 has eighty-one memory elements 308. However, it is to be understood that the depiction of eighty-one memory elements is for convenience sake and that in some embodiments each partition could have up to at least a billion memory elements. To put it another way, the number of memory elements per volatile memory partition can be enormous and vary greatly.

The 3D SIC can also have a processing logic die having an array of processing logic partitions. Each partition can have a separate field-programmable gate array (FPGA) or another type of processing logic device. The processing logic die can include a controller unit and an arithmetic/logic unit. For instance, the arithmetic/logic unit can include an FPGA.

Figure 4:
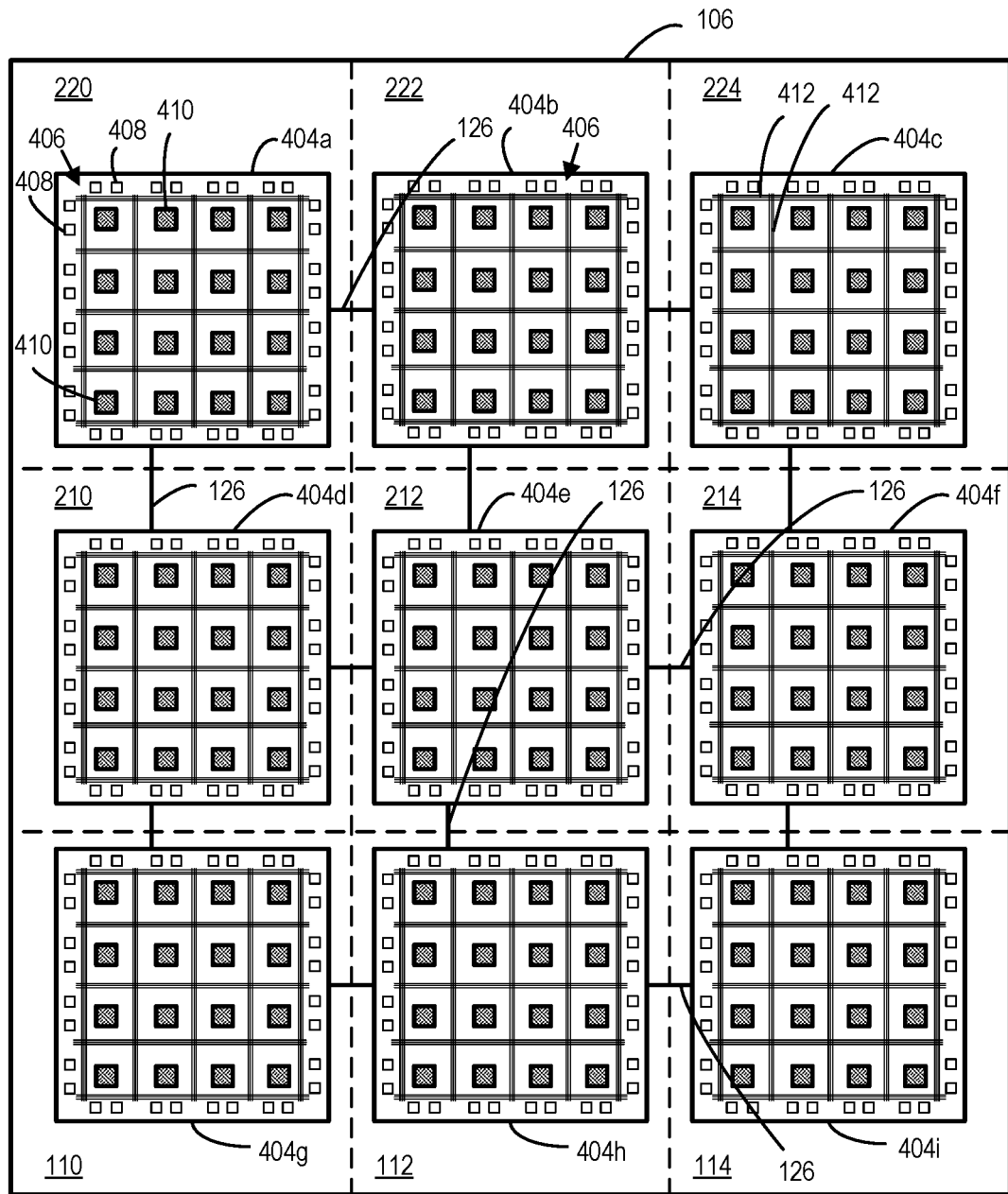
FIG. 4 illustrates a top view of an example processing logic die having multiple processing logic partitions (each partition having a separate field-programmable gate array) in accordance with some embodiments of the present disclosure.

FIG. 4 illustrates a top view of the processing logic die 106 having multiple processing logic partitions 404a, 404b, 404c, 404d, 404e, 404f, 404g, 404h, and 404i in accordance with some embodiments of the present disclosure. FIG. 4 shows each of the partitions 404a, 404b, 404c, 404d, 404e, 404f, 404g, 404h, and 404i having a separate FPGA 406. As shown, each of the nine FPGAs 406 illustrated in FIG. 4 has thirty-two input/output blocks 408 and sixteen logic blocks 410. Also, FIG. 4 shows programmable or non-programmable interconnects 412 between the input/output blocks 408 and the logic blocks 410 of each of the nine FPGAs 406. It is to be understood that the depiction of the amount of input/output units and logic units of an FPGA 406 is for convenience sake and that in some embodiments each FPGA of a partition could have more or less input/output units and logic units depending on the embodiment of the corresponding functional block. Also, even though FIG. 4 shows one FPGA per partition, it is to be understood that each processing logic partition can have multiple FPGAs in other embodiments of the 3D SIC or the processing logic die. To put it another way, the number of specific parts of the processing logic die can vary greatly.

FIGS. 2, 3, and 4 also show the functional blocks 110, 112, 114, 210, 212, 214, 220, 222, and 224 of the 3D SIC 100. FIG. 2 shows a top view of respective sections of the functional blocks at the non-volatile memory die 102. FIG. 3 shows a top view of respective sections of the functional blocks at the volatile memory die 108. FIG. 4 shows a top view of respective sections of the functional blocks at the processing logic die 106.

FIGS. 2, 3, and 4 also show the interconnects 122, 128, and 126 interconnecting the non-volatile memory partitions, the volatile memory partitions, and the processing logic partitions respectively. Thus, the interconnects 122, 128, and 126 are also shown interconnecting the functional blocks of the 3D SIC 100 at each layer of the 3D SIC. Specifically, as shown in FIG. 2, the interconnects 122 interconnect the non-volatile memory partitions 204a, 204b, 204c, 204d, 204e, 204f, 204g, 204h, and 204i of the non-volatile memory die 102. As shown in FIG. 3, the interconnects 128 interconnect the volatile memory partitions 304a, 304b, 304c, 304d, 304e, 304f, 304g, 304h, and 304i of the volatile memory die 108. And, as shown in FIG. 4, the interconnects 126 interconnect the processing logic partitions 404a, 404b, 404c, 404d, 404e, 404f, 404g, 404h, and 404i of the processing logic die 106.

In the 3D SIC, the non-volatile memory die, the volatile memory die, and the processing logic die are stacked in a first direction (e.g., vertically), and the processing logic die can be stacked in between the non-volatile memory die and the volatile memory die. The 3D SIC can also have an array of functional blocks which are made up from the dies of the 3D SIC. To put it another way, the non-volatile memory die, the volatile memory die, and the processing logic die are arranged to form the array of functional blocks. At least two functional blocks of the array of functional blocks each can include a different data processing function that reduces the computation load of a controller—such reducing the computational load of a CPU. Each functional block of the array of functional blocks can include a respective column of the 3D SIC. A respective column of the 3D SIC can include a respective non-volatile memory partition of the array of non-volatile memory partitions, a respective volatile memory partition of the array of volatile memory partitions, and a respective processing logic partition of the array of processing logic partitions. A respective processing logic partition can be stacked in the first direction in between a respective non-volatile memory partition and a respective volatile memory partition.

Figure 5:
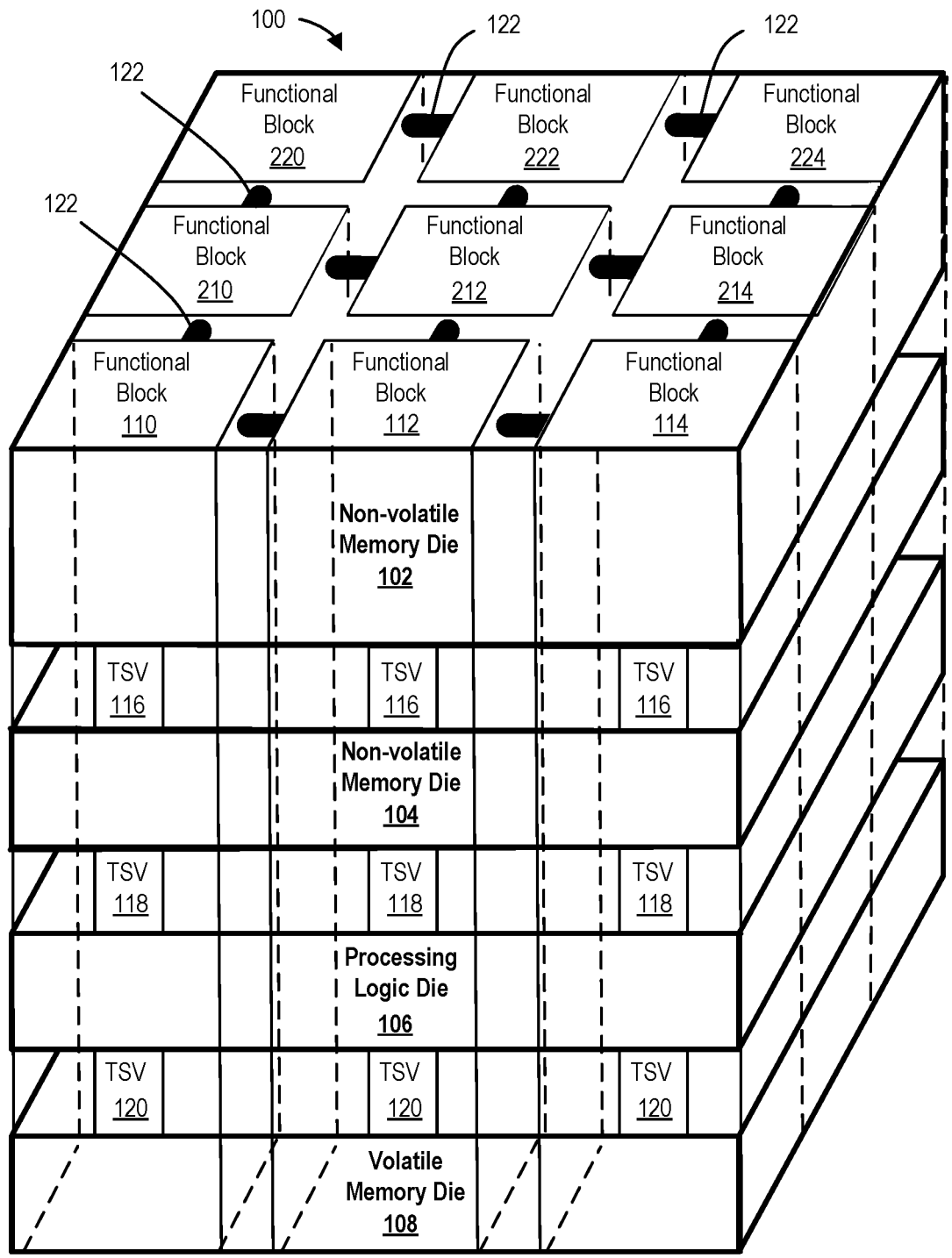
FIG. 5 illustrates a perspective view of the example 3D SIC illustrated in FIG. 1 having multiple non-volatile memory dies, a volatile memory die, and a processing logic die in accordance with some embodiments of the present disclosure.

FIG. 5 illustrates a perspective view of the 3D SIC 100 illustrated in FIG. 1 having multiple non-volatile memory dies 102 and 104, volatile memory die 108, and processing logic die 106 in accordance with some embodiments of the present disclosure. FIG. 5 shows perspective views of the non-volatile memory dies 102 and 104, the volatile memory die 108, and the processing logic die 106 and how the dies are stacked in a first direction (e.g., vertically), and how the processing logic die can be stacked in between the non-volatile memory dies and the volatile memory die. FIG. 5 also shows the array of functional blocks completely in that all the functional blocks 110, 112, 114, 210, 212, 214, 220, 222, and 224 of the 3D SIC 100 are depicted.

It is to be understood that the number of functional blocks of a 3D SIC can vary depending on the embodiment of the 3D SIC. Each functional block of the array of functional blocks illustrated in FIGS. 1-5 can include a respective column of the 3D SIC 100, as shown. And, as shown by the combination of FIGS. 1-5, a column of the 3D SIC, having a single functional block, can include a respective non-volatile memory partition of the array of non-volatile memory partitions, a respective volatile memory partition of the array of volatile memory partitions, and a respective processing logic partition of the array of processing logic partitions. Also, shown by the combination of these drawings, a respective processing logic partition can be stacked in a first direction (e.g., vertically) in between a respective non-volatile memory partition and a respective volatile memory partition.

In some embodiments, each of two abutting functional blocks of the array of functional blocks can have different particular data processing functions that are commonly used together for a greater particular data processing function. Particular data processing functions can include fundamental processes of a CPU, such as decoding processes of a decode operation of CPU.

Embodiments of the 3D IC or at least a group of functional blocks of some embodiments can function as an instruction decoder for a CPU. This way the CPU can reserve resources for fetching and execution operations, when connected to such embodiments of the 3D IC.

Particular data processing functions can also include functions of an arithmetic logic unit of a CPU, such as integer arithmetic and bitwise logic operations. This way the CPU can reserve resources by delegating arithmetic logic unit operations to such embodiments of the 3D IC.

Also, embodiments of the 3D IC or at least a group of functional blocks of some embodiments can function as different types of encoders and/or decoders besides those usually hardwired or programmed into a CPU. For example, embodiments of the 3D IC or at least a group of functional blocks of some embodiments can function as an encryption block wherein the 3D IC or at least a group of functional blocks have a cipher that can generate a Ciphertext. Also, embodiments can function as a decryption block. In one embodiment, one or more blocks of the 3D IC can be dedicated to encryption and other one or more blocks of the same 3D IC can be dedicated to decryption. Also, embodiments of the 3D IC or at least a group of functional blocks of some embodiments can function as one or more data processing intensive operations, such as data intensive operations of a type of machine learning.

The 3D SIC can also include a first set of TSVs that connect the respective non-volatile memory partition and the respective processing logic partition in the respective column of the 3D SIC (e.g., TSVs 118 as shown in FIGS. 1 and 5) as well as a second set of TSVs that connect the respective volatile memory partition and the respective processing logic partition in the respective column of the 3D SIC (e.g., TSVs 120 as shown in FIGS. 1 and 5).

In some embodiments, processing logic die can include a control unit and an arithmetic/logic unit, and each of the memory ICs can include storage parts that are addressable by an address decoder and/or have predefined addresses. In such embodiments, the control unit is connected in a first direction (e.g., vertically) with the storage parts of the memory ICs and the arithmetic/logic unit is connected in the first direction with the storage parts of the memory ICs and/or the parts of the IC are connected to the storages parts of the memory ICs via an address decoder.

In some embodiments including the control unit and the arithmetic/logic unit, the control unit is configured to, during an instruction time, get instructions from the volatile memory IC of the 3D IC and decode the instructions and direct data to be moved from the volatile memory IC to the arithmetic/logic unit according to at least part of the instructions. And, the arithmetic/logic unit can be configured to, during an execution time, execute the at least part of the instructions and store a result of the execution of the at least part of the instructions in a non-volatile memory IC of the 3D IC.

In such embodiments, the arithmetic/logic unit is given control and performs the actual operation on the data. The combination of instruction time and execution time can be a machine cycle of the 3D IC, and in some embodiments, the control unit can direct, during the execution time, the volatile memory IC and/or the non-volatile memory IC to release the result to an output device or a storage device external of the apparatus. In some embodiments, connections between the control and arithmetic/logic units and the memory units of the memory ICs are connections that can be TSVs. To put it another way, the control unit can be connected in a first direction (e.g., vertically), by a plurality of electrical connections, with the memory elements of the memory ICs and the arithmetic/logic unit is connected, by a plurality of electrical connections, with the memory elements of the memory ICs.

The memory cells and logic units of each IC or die of the 3D IC can be connected to each other by a plurality of electrical connections. For example, the 3D SIC can also include a first set of interconnects that connect non-volatile memory partitions of the array of non-volatile memory partitions in a second direction that is orthogonal to the first direction (e.g., a horizontal direction), e.g., interconnects 122 as shown in FIGS. 1 and 2, a second set of interconnects that connect volatile memory partitions of the array of volatile memory partitions in the second direction, e.g., interconnects 128 as shown in FIGS. 1 and 3, and a third set of interconnects that connect processing logic partitions of the array of processing logic partitions in the second direction, e.g., interconnects 126 as shown in FIGS. 1 and 4. In some embodiments having the three sets of interconnects, a interconnect of the first set of interconnects only connects a non-volatile memory partition of the array of non-volatile memory partitions to another non-volatile memory partition directly next to the non-volatile memory partition (e.g., see interconnects 122 as shown in FIGS. 1 and 2). Also, in such embodiments, an interconnect of the second set of interconnects only connects a volatile memory partition of the array of volatile memory partitions to another volatile memory partition directly next to the volatile memory partition (e.g., see interconnects 128 as shown in FIGS. 1 and 3). And, an interconnect of the third set of interconnects only connects a processing logic partition of the array of processing logic partitions to another processing logic partition directly next to the processing logic partition (e.g., see interconnects 126 as shown in FIGS. 1 and 4).

Some exemplary embodiments of the 3D SIC includes a processing logic die, a 3DXP die, and a DRAM die, with the processing logic die being stacked between the 3DXP die and the DRAM die. In such exemplary embodiments, a set of TSVs interconnect the processing logic die, the 3DXP die, and the DRAM die. In such exemplary embodiments or some other exemplary embodiments, the 3D SIC includes a 3DXP die having an array of non-volatile memory partitions, with each partition of the array of non-volatile memory partitions having an array of non-volatile memory cells. In such embodiments, a volatile memory die has an array of volatile memory partitions, with each partition of the array of volatile memory partitions having an array of volatile memory cells. Also, in such embodiments, a processing logic die is included and has an array of processing logic partitions. And, the 3DXP die, the volatile memory die, and the processing logic die are stacked in a first direction (e.g., vertically) with the processing logic die stacked in between the 3DXP die and the volatile memory die. Further, such embodiments of the 3D SIC can include a first set of TSVs that connect, in the first direction, a respective non-volatile memory partition and a respective processing logic partition in a respective column of the 3D SIC. And, such embodiments can include a second set of TSVs that connect, in the first direction, a respective volatile memory partition and the respective processing logic partition in the respective column of the 3D SIC.

The 3D SIC can also have multiple non-volatile memory dies (as shown in FIGS. 1 and 5). For example, the 3D SIC can include a second non-volatile memory die can include a second array of non-volatile memory partitions. And, each partition of the second array of non-volatile memory partitions can have an array of non-volatile memory cells. In embodiments where the 3D SIC has multiple non-volatile memory dies, the non-volatile memory dies (such as the first and second non-volatile memory dies) can be grouped together such that the processing logic die is in between the volatile memory die and the group of non-volatile memory dies (as shown in FIGS. 1 and 5).

In some embodiments of the 3D SIC, each functional block of the 3D SIC can have a respective communications interface (i.e., a respective port) configured to communicatively couple the block to a bus so that each block can operate in parallel and independently of the other. Additionally or alternatively, groups of at least two functional blocks of the 3D SIC each share a respective communications interface configured to communicatively couple the at least two functional blocks to a bus, so that each group of at least two functional blocks can operate in parallel and independently of another group of at least two functional blocks. Additionally, or alternatively, the 3D SIC can have one or more universal communications interfaces (i.e., one or more universal ports) configured to communicatively couple any one or all of the functional blocks of the 3D SIC to a bus.

Figure 6:
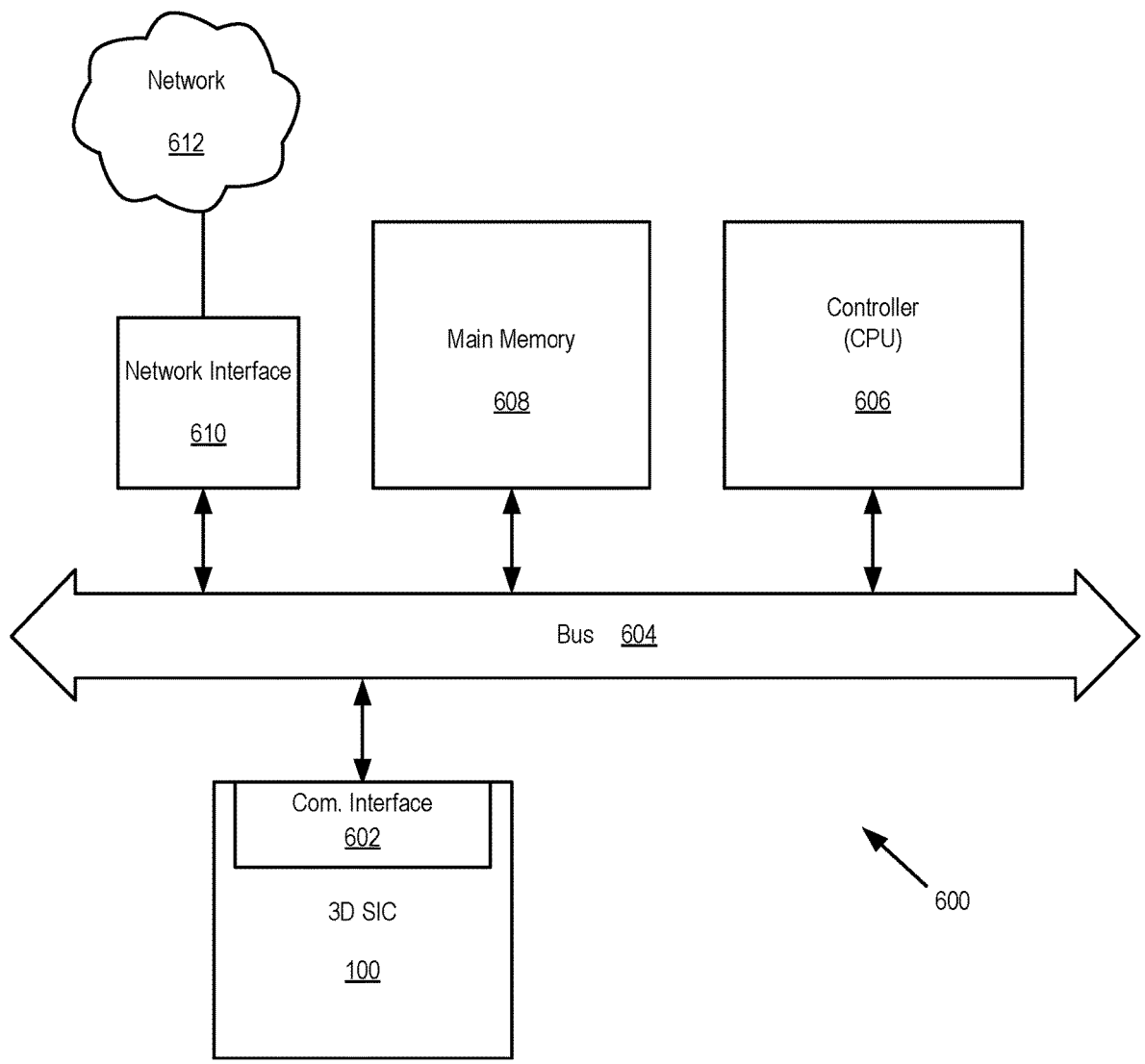
FIG. 6 illustrates a block diagram of an example computer system in which embodiments of the present disclosure can operate.

FIG. 6 illustrates a block diagram of an example computer system 600 in which embodiments of the present disclosure can operate. As shown in FIG. 6, the computer system 600 includes the 3D SIC 100 that includes a communications interface 602 (or also referred to as port 602). The communications interface 602 is communicatively coupled to a bus 604 of the computer system 600. The bus 604 is communicatively coupled to a controller of the computer system 600 (e.g., a CPU of the system 600) as well as a main memory 608 and network interface 610 of the computer system 600. As shown in FIG. 6, the network interface 610 communicatively couples the computer system 600 to a computer network 612.

The computer system 600 can be or include a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that computerized system. Further, while a single computer system 600 is illustrated, the term "computer system" shall also be taken to include any collection of computer systems. The bus 604 can be or include multiple buses. The controller 606 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Controller 606 can also be one or more special-purpose processing devices such as an application specific integrated circuit (ASIC), an FPGA, a digital signal processor (DSP), network processor, or the like. The main memory 608 can be a read-only memory (ROM), flash memory, DRAM such as synchronous DRAM (SDRAM) or Rambus DRAM (RDRAM), and/or SRAM.

Referring to FIGS. 1 and 6, in some embodiments, the port 602 can be configured to communicatively couple the volatile memory die 108 to the bus 604. In such an arrangement, the controller 606 can delegate data processing functions to the 3D SIC 100 via the bus 604 and the volatile memory die 108. The delegated data processing functions can be data intensive functions or commonly used functions of the controller 606. As mentioned, in some embodiments, the processing logic IC or die does not have a full array of processing cores that a typical CPU would have. But, in such embodiments, the processing logic can implement frequently used functions and/or data intensive functions; thus, having potential to relieve the CPU of significant processing duties and enhancing the performance of the CPU. Also, in the depicted embodiments, a functional block cannot execute complete set of multifunctional instructions on its own. Therefore, a functional block and the remainder of the 3D SIC 100 can be connected to a controller (such as a CPU) and the controller can instruct the function block to do a task it is configured to do.

For example, a functional block of example embodiments can be configured to decrypt, by its processing logic partition, the data stored in its corresponding non-volatile memory partition, and insert the decrypted data into its corresponding volatile partition to be communicated to the controller for further processing by controller.

Also, in general, the controller can provide a request to the volatile memory partition of a functional block to request the block to generate a result of a certain function, and the controller can also provide a second or follow-up request to retrieve the result from the functional block. For instance, the request for generation of the result can be provided from the controller to the functional block in the form of a write command, and the request to retrieve the result can be provided from the controller to the functional block in the form of a read command.

Figure 7:
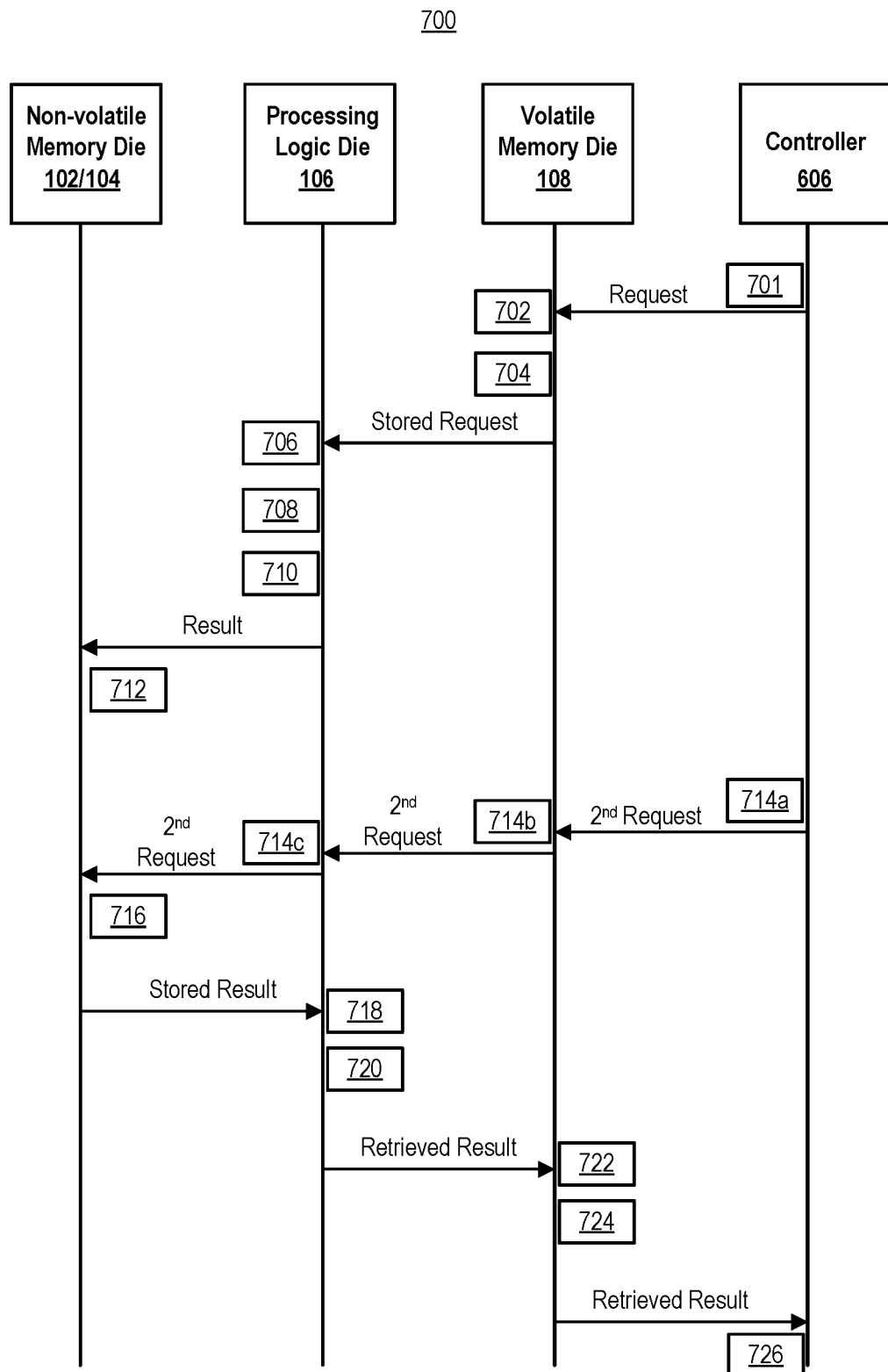
FIG. 7 illustrates a flow diagram of an example method in which embodiments of the present disclosure can perform along with a controller.

FIG. 7 illustrates a flow diagram of an example method 700 in which embodiments of the 3D SIC (e.g., 3D SIC 100 of FIGS. 1-6) can interact with a controller (e.g., controller 606 of FIG. 6) via a bus (e.g., bus 604 of FIG. 6).

The method 700 in general can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order and performed by particular hardware/software, unless otherwise specified, the order and hardware/software of the processes can be modified. Thus, the illustrated embodiments should be understood only as examples, and the illustrated processes can be performed in a different order and/or by different hardware/software, and some processes can be performed in parallel. Additionally, one or more processes can be omitted in various embodiments. Thus, not all processes are required in every embodiment. Other process flows are possible as well.

Specifically, the method 700 can be performed by at least the non-volatile memory die 102 and/or the non-volatile memory die 104, the processing logic die 106, the volatile memory die 108, and the controller 606 (as illustrated in FIG. 7). At block 701, the controller 606 communicates a request, via a bus. The request of the controller 606 is configured to instruct the 3D SIC to generate a result of a particular data processing function. Such a request can be delivered to the 3D SIC via a write command of the controller 606. For example, if a write command is used by the controller 606 to make the request, then the request is sent to the selected volatile memory partition of the volatile memory die 108. Alternatively, an execute command can be used by the controller 606 to make the request, and in such instances the request can be directly sent to the selected processing logic partition of the processing logic die 106.

At block 702, the volatile memory die 108 receives the request via the bus. The volatile memory die 108 can be configured to receive, from the bus through the port 602, the request of the controller. In addition to being configured to instruct the 3D SIC to generate a result of a particular data processing function, the request can include at least one input parameter of the particular data processing function. At block 704, the volatile memory die 108 stores the request and communicates the request to the processing logic die 106. The volatile memory die 108 can be configured to store the request in at least one volatile partition of the volatile memory die.

At block 706, the stored request is received by the processing logic die. And, at block 706, the at least one input parameter of the particular data processing function can be received by the at least one processing logic partition through a TSV connecting the at least one volatile partition of the volatile memory die and the at least one processing logic partition.

At block 708, the processing logic die generates the result accordingly to the stored request. At least one processing logic partition of the processing logic die 106 can include the particular data processing function and the particular data processing function can generate the result according to the stored request and the at least one input parameter of the particular data processing function. The particular data processing function can be hardwired into the at least one processing logic partition of the processing logic die. Alternatively, the particular data processing function can be configured, by the controller 606 or another controller, in the at least one processing logic partition of the processing logic die temporarily. For example, the particular data processing function can be implemented by an FPGA configurable by the controller 606 or another controller.

At block 710, the processing logic die 106 communicates the result to the non-volatile memory die 102 and/or the non-volatile memory die 104. The processing logic die 106 can be configured to communicate the generated result of the particular data processing function to the non-volatile memory die via a TSV connecting at least one non-volatile partition of the non-volatile memory die and the at least one processing logic partition.

At block 712, the non-volatile memory die 102 and/or the non-volatile memory die 104 receives and stores the result that is communicated from the processing logic die 106. The non-volatile memory die 102 and/or the non-volatile memory die 104 can be configured to store the generated result in at least one non-volatile partition and communicate the stored result to the processing logic die 106 upon the processing logic die requesting the stored result. The processing logic die 106 requesting the stored result can be in response to the volatile memory die 108 requesting the stored result which can be in response to the controller 606 requesting the stored result via the bus 604.

The processing logic die 106 can be configured to retrieve the stored result from the non-volatile memory die via a TSV connecting the at least one non-volatile partition and the at least one processing logic partition. And, the 3D SIC can be configured to communicate the retrieved result to the volatile memory die via a TSV connecting the at least one volatile partition and the at least one processing logic partition. The volatile memory die can be configured to receive and store the retrieved result in the at least one volatile partition, and communicate, via the port, the stored retrieved result to the bus according to a second request of the controller, when the second request of the controller is configured to instruct the 3D SIC to retrieve a result generated by the particular data processing function. In some examples, where a read command is used by the controller 606 to make the second request, the second request is sent to the selected volatile memory partition of the volatile memory die 108.

With respect to FIG. 7, at block 714*a*, the controller communicates the second request that is configured to instruct the 3D SIC to retrieve a result generated by the particular data processing function. At block 714*b*, the second request is received, stored, and sent to the processing logic die 106, by the volatile memory die 108. At block 714*c*, the second request is received, stored, and forwarded to the non-volatile memory die 102 and/or the non-volatile memory die 104, by the processing logic die 106.

At block 716, in response to block 714*c*, the non-volatile memory die 102 and/or the non-volatile memory die 104 communicates the stored result to the processing logic die 106. At block 718, the processing logic die 106 receives the retrieved result, and at block 720, the processing logic die 106 communicates the retrieved result to the volatile memory die 108. The processing logic die 106 can be configured to retrieve the stored result from the non-volatile memory die via the TSV connecting the at least one non-volatile partition and the at least one processing logic partition. And, the processing logic die 106 can be configured to communicate the retrieved result to the volatile memory die via the TSV connecting the at least one volatile partition and the at least one processing logic partition.

At block 722, the volatile memory die 108 receives and stores the retrieved result sent from the processing logic die 106. At block 724, the retrieved result is then communicated to the controller 606, by the volatile memory die 108. The volatile memory die can be configured to receive and store the retrieved result in the at least one volatile partition as well as be configured to communicate, via the port, the stored retrieved result to the bus according to a second request of the controller configured to instruct the 3D SIC to retrieve a result generated by the particular data processing function.

At block 726, the controller 606 receives the retrieved result. The retrieve result can be used by the controller 606 for another processing step or outputted by the controller to another device.

In such embodiments, at least two of a volatile partition, a non-volatile partition, and a processing logic partition can be in the same one or more columns of the 3D SIC. For example, a volatile partition, a non-volatile partition, and a processing logic partition used together can be in the same one or more columns of the 3D SIC. Also, in some embodiments, each of two abutting functional blocks of the array of functional blocks can have different sub-particular data processing functions of the particular data processing function.

A particular data processing function (such as the particular data processing function described with the method 700) can include a fundamental process of the controller 606. For example, if the controller 606 is a CPU, the fundamental process can be a decoding process of the decode operation of a CPU. The processing logic die 106 can be programmed or hardwired as a decoder for a CPU or at least a common part or data intensive part of a decoder for a CPU. This way a CPU can reserve resources for fetching and execution operations, when connected to the 3D SIC 100.

The particular data processing function can also include the processing logic providing at least part of the functionality of an arithmetic logic unit of a CPU and such functionality can be programmed or hardwired into the processing logic die 106. And, abutting partitions of the processing logic die 106 can provide sub-operations of an arithmetic logic unit such as different integer arithmetic and bitwise logic operations. This way the CPU can reserve resources by delegating arithmetic logic unit operations to the 3D SIC 100.

Also, the processing logic die 106 can function as different types of encoders and/or decoders besides those usually hardwired or programmed into a CPU. For example, with embodiments of the 3D SIC 100 or at least a group of functional blocks of some embodiments, the 3D SIC 100 can provide an encryption function wherein the 3D IC or at least a group of functional blocks have a cipher hardwired or programmed into the processing logic die 106 so that the die can generate a ciphertext and then the ciphertext can be stored immediately in the non-volatile memory die 102 and/or the non-volatile memory die 104 of the 3D SIC 100 for subsequent retrieval by the controller 606. And, the processing logic die 106 or partitions of the die can function as a decryption algorithm. In one embodiment, one or more blocks of the 3D SIC 100 can be dedicated to encryption and other one or more blocks of the 3D IC can be dedicated to decryption.

Also, the 3D SIC 100 or at least a group of functional blocks of some embodiments can function as one or more certain data processing intensive operations, such as selected data intensive operations of a type of machine learning. And, data intensive operations that are immediately preceding or following each other in a machine learning algorithm or another type of complex computerized algorithm can be implemented by blocks of the 3D SIC 100 that are abutting each other. Thus, speeding up the transitional time between operations of an algorithm as well as providing other benefits such as reduced power consumption.

In some embodiments, a first memory IC of a 3D IC can provide non-volatile storage parts when the apparatus is powered on. Each non-volatile storage part of the non-volatile storage parts stores a bit while receiving power or not while receiving power. Also, a second memory IC of the 3D IC can provide volatile storage parts when the apparatus is powered on. Each volatile storage part of the volatile storage parts stores a bit only while receiving power. In such embodiments, electrical connections of the 3D IC can communicatively couple, in a second direction that is orthogonal to the first direction (e.g., a horizontal direction), first storage parts of the first memory IC to each other and second storage parts of the second memory IC to each other when the apparatus is powered on. And, electrical connections in a first direction (e.g., vertically) of the 3D IC can communicatively couple a control unit and an arithmetic/logic unit of a processing logic IC of the 3D IC to the storage parts of the first and second memory ICs to control use the storage parts, when the apparatus is powered on.

In such embodiments, during a machine cycle of the 3D IC, the control unit can get instructions from the first memory IC and/or the second memory IC during the instruction time of the machine cycle. And, during a machine cycle of the 3D IC the control unit or a decoder controlled by the control unit can decode the instructions and direct data to be moved from the first memory IC and/or the second memory IC to the arithmetic/logic unit according to at least part of the instructions during the instruction time. Also, during a machine cycle, the arithmetic/logic unit can execute the at least part of the instructions during the execution time of the machine cycle, and store a result of the execution of the at least part of the instructions in the first memory IC and/or the second memory IC during the execution time. Further, during a machine cycle, the control unit can direct the first memory IC and/or the second memory IC to release the result to an output device or a storage device external to the apparatus during the execution time.

In one example system of some embodiments, the system can include a first functional block that includes a first processing logic IC, a first memory IC, and a second memory IC. The first processing logic IC, the first memory IC, and the second memory IC can be arranged in a first direction (e.g., vertically) as a stack of ICs to form the first functional block. The system can also include a second functional block that can include a second processing logic IC, a third memory IC, and a fourth memory IC. The second processing logic IC, the third memory IC, and the fourth memory IC can be arranged in the first direction as a stack of ICs to form the second functional block. The system can also include at least one bus or an interconnect that communicatively couples the first functional block and the second functional block.

In such an example system, the first and second functional blocks are each configured differently from each other for different respective data processing functions. The data processing functions can be different frequently used functions and/or data intensive functions, such that even though each processing logic IC of a block may not have the processing power of a CPU, its advantage in improved (e.g., closer) data access to non-volatile and volatile memory so that it can provide a better overall performance in implementing selected functions. Each functional block of the first and second functional blocks can configurable on demand by a controller (e.g., a CPU) that is connected to the functional blocks via a wired and/or wireless bus. Each functional block of the first and second functional blocks can be configured to reduce the computation load of the controller. The configuration of each functional block of the first and second functional blocks can include on demand configuration of the respective processing logic IC of the functional block. Each functional block of the first and second functional blocks can be configured to operate independently from each other. Each functional block of the first and second functional blocks is configured to operate in parallel to provide parallel data processing.

In one example method of some embodiments implemented by multiple functional blocks of one or more 3D ICs, a functional block of the multiple functional blocks can perform a first data processing function that includes a processing logic IC controlling storage and retrieval of data to and from first and second memory ICs. The functional block can also be changed on demand (such as by a CPU), so that the functional block is configured to perform a second data processing function. The functional block can also perform the second data processing function that includes the processing logic IC controlling storage and retrieval of data to and from the first and second memory ICs in a different way from the way the processing logic IC controls storage and retrieval of data to and from the first and second memory ICs during the first data processing function. In such an example method, each functional block of the multiple functional blocks includes a respective processing logic IC, a respective first memory IC, and a respective second memory IC, and the respective processing logic IC, the respective first memory IC, and respective the second memory IC are arranged in a first direction (e.g., vertically) as a stack of ICs to form the functional block.

At least some aspects of the present disclosure are directed to 3D SICs having functional blocks supported by failure management. Also, in general, aspects of the present disclosure are directed to 3D ICs having failure management including configurable routes to bypass a failed functional block or failed part of a functional block such as a failed layer of a functional block.

Some embodiments disclosed herein can include a 3D SIC having stacked chips, wherein each chip can be partitioned into sections or partitions. A set of stacked partitions, which are columns of the 3D SIC, can be functional blocks of the 3D SIC. Different functional blocks and partitions of the functional blocks, which are layers of the functional blocks, can have configurable routes to bypass a failed block or partition. The configurable routes can also be configured to bypass a specific part within a partition or layer.

When a functional block, partition, or specific part of a partition fails, configurable bypass routes are enabled to prevent the failing of the entire 3D SIC. Resources in the sections are monitored for failure and routes to resources are re-routed if failure is detected. For instance, when the processing logic in one partition fails, the data for processing at the failing processing logic can be routed to a neighboring processing logic partition. That neighboring process logic partition can be a reserved spare section for processing. Also, when connections within a section fails, alternative connections can be configured to bypass the failed connections. Thus, the 3D SIC can degrade over a period of time, but be prevented from failing as a whole and abruptly.

A component that is about to fail can be discovered by its error rate. For example, as its error rate increases above a threshold. Or, for example, failure can be discovered by a function retrying more than a threshold number of times to get an expected result.

As illustrated herein, some embodiments can include a 3D SIC having heterogeneous layers that is partitioned into stacked columns or functional blocks (such as the functional blocks of FIGS. 1-5 and 8-11). Each functional block has independent functionality and each functional block can replace the functionality of another functional block. The 3D SIC can sense if a column is failing or about to fail and processing and/or storage provided by the failing or impending failing column can be re-routed to a different column of the 3D SIC upon sensing the column failure or the impending failure. Different sections can have configurable routes to bypass a failed section. And, configurable routes can be somewhere in the 3D SIC, but not necessarily in each column.

The 3D SIC can be self-monitoring and self-controlling. And, the rerouting can occur by simple sensors and switches integrated into the layers of the 3D SIC. Each layer having a corresponding die, and the die is partitioned such that each functional block has a respective partition of the die.

In some embodiments, each failing functional block can be bypassed upon its failure. Alternatively, in some embodiments, only selected blocks can be bypassed upon failure of such blocks. One of the reasons for having the bypass routes is so that upon a failure of a functional block or a layer of a block, failure of the entire 3D SIC can be prevented. Some blocks can be merely deactivated or automatically avoided upon a certain amount of failure.

Analogous functionality can be provided at the layer level within a functional block as well. For instance, if a first 3DXP partition or layer in the heterogenous functional block is failing or about to fail (e.g., in which the failure or the impending failure can be sensed by a simple integrated sensor), data storage and/or retrieval occurring at the first 3DXP layer can be redirected to a second 3DXP layer of the functional block and/or a neighboring functional block. Further, for example, if all the 3DXP layers of a first stack are failing or about to fail, then the first stack can redirect its data storage and/or retrieval to one or more 3DXP layers of a second functional block of the 3D SIC.

In some embodiments, the aforesaid functionality can be implemented with bypass routes at each layer of the 3D SIC. Also, the functional blocks can share resources using the bypass routes. The bypass routes can occur within a partially failing functional block and within neighboring columns. Also, the bypass routes can occur within the 3D SIC but external to a functional block.

Figure 8:
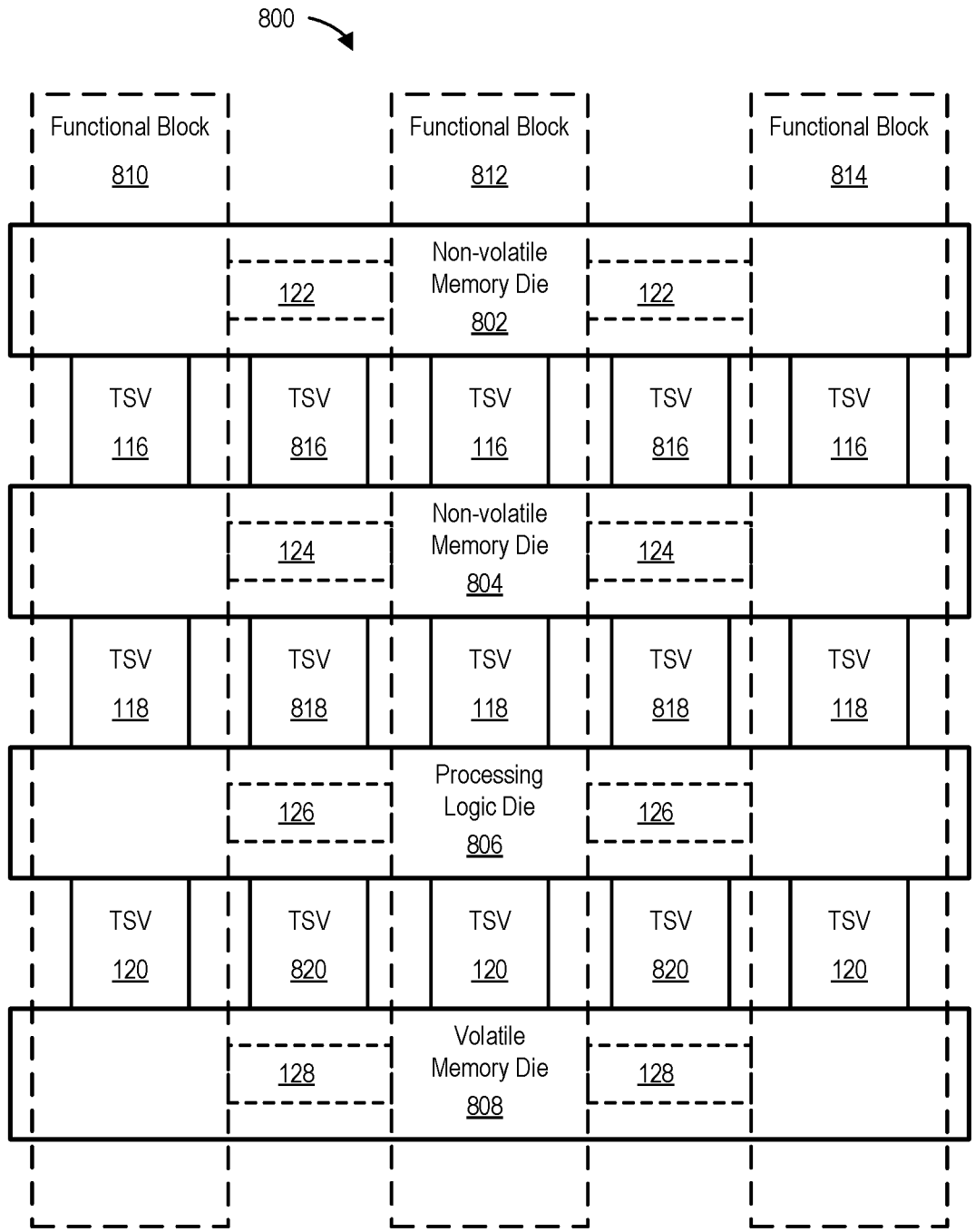
FIG. 8 illustrates a front view of another example 3D SIC, having multiple non-volatile memory dies, a volatile memory die, a processing logic die, and configurable routes in accordance with some embodiments of the present disclosure.

An inner functional block in the middle of the 3D SIC can possibly share resources with four other functional blocks to each side of the inner block (e.g., see functional block 212 in FIGS. 5 and 8). In such examples, a corner functional block would share resources with two other functional blocks (e.g., see functional block 224 in FIGS. 5 and 8). In some embodiments, columns that are directly diagonal to each other can share resources too. In some embodiments, the corner column could share with the inner column as well as the two side columns abutting it. Note that there could be more columns of the 3D SIC, but the drawings depict nine columns as a basic way of illustrating the positioning of columns.

The sensors integrated into the layers of the 3D SIC can be at least partially implemented as error detecting logic circuits. Or, error detecting logic circuits can operate and be independent of a sensor. The error detecting logic circuits can include a circuit that can determine whether a communication can go through a signal route. The error detecting logic circuits can also include a circuit that can determine whether a retrieved result and/or a computed result is expected or unexpected. Such results can be retrieved from a memory layer of a functional block of the 3D SIC. Also, computed results, in particular, can be retrieved from a memory layer or a logic layer of a functional block. Such results can be computed by a logic layer of a functional block.

In some embodiments, the rerouting can be at least partially implemented by a memory translation layer such as a flash translation layer. Such a layer can remap logical addresses to physical addresses to do wear leveling and/or put failing memory cells out of service.

The 3D SIC can have a spare functional block in that it is not used regularly and/or frequently. This can be advantageous when a block fails, because the spare column can be ready to support a failing column since it is not being used for other functions. The spare block can be put into service to replace the failed block. The replacement can occur through reconfiguring of communication routes and/or computation workloads. Such a reconfiguration in the 3D SIC can virtually put the spare column in the place of the failed block and thus maintain the continued operation of the 3D SIC overall. Also, the functionality of a failed block can be redistributed to working blocks with a level of performance degradation to avoid a catastrophic failure of the 3D SIC.

FIG. 8 illustrates a front view of an example 3D SIC 800 having configurable routes. For example, as shown in FIG. 8, TSVs 116, 816, 118, 818, 120, and 820 are parts of the configurable routes of the 3D SIC 800 in accordance with some embodiments of the present disclosure. The 3D SIC 800 is also shown having non-volatile memory dies 802 and 804, a volatile memory die 808, and a processing logic die 806 in accordance with some embodiments of the present disclosure. As shown, the non-volatile memory dies 802 and 804, the volatile memory die 808, and the processing logic die 806 are arranged to form an array of functional blocks (e.g. see functional blocks 810, 812, and 814 as shown in FIG. 8).

Figure 9:
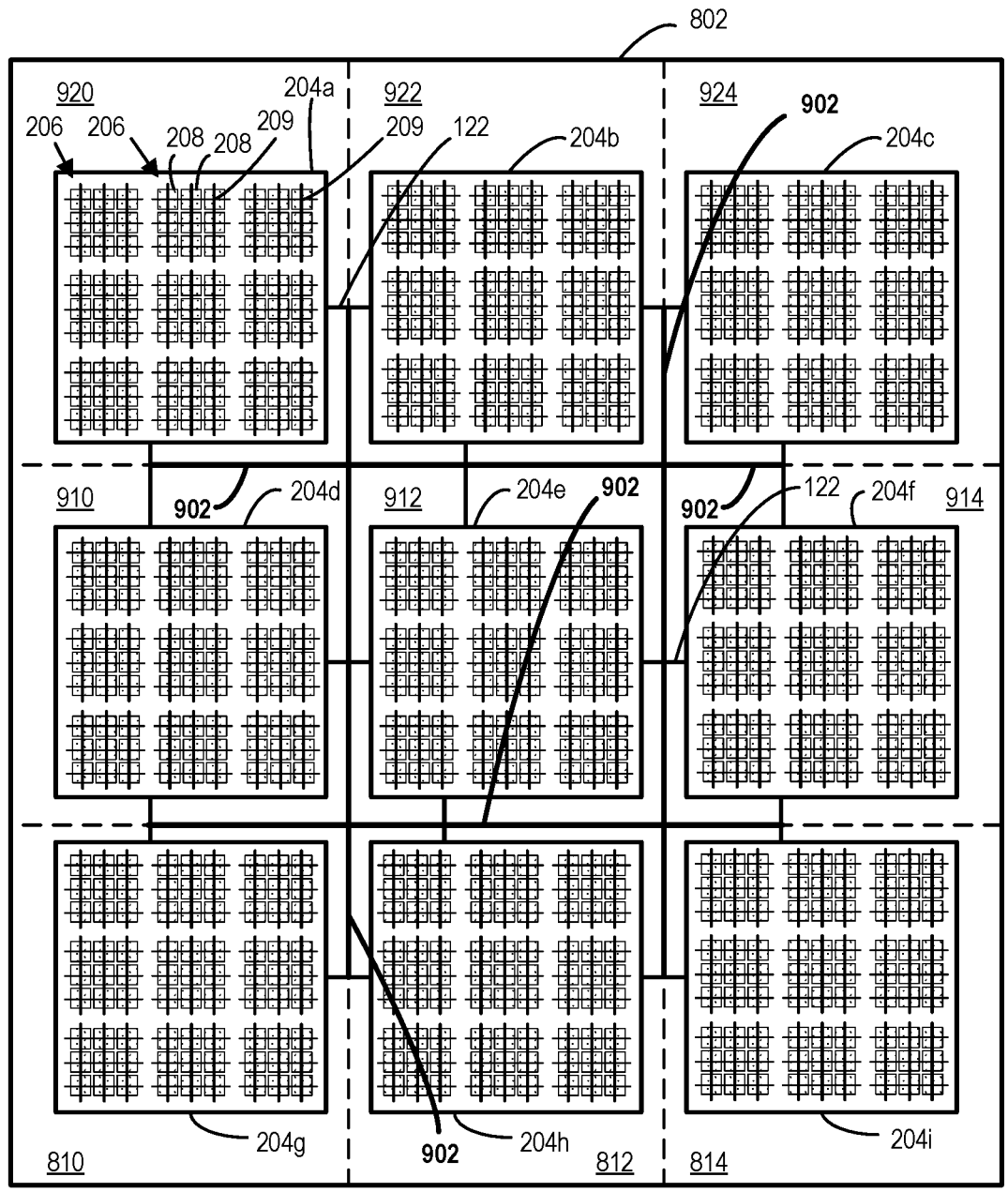
FIG. 9 illustrates a top view of an example non-volatile memory die having multiple non-volatile memory partitions and configurable routes in accordance with some embodiments of the present disclosure.
Figure 10:
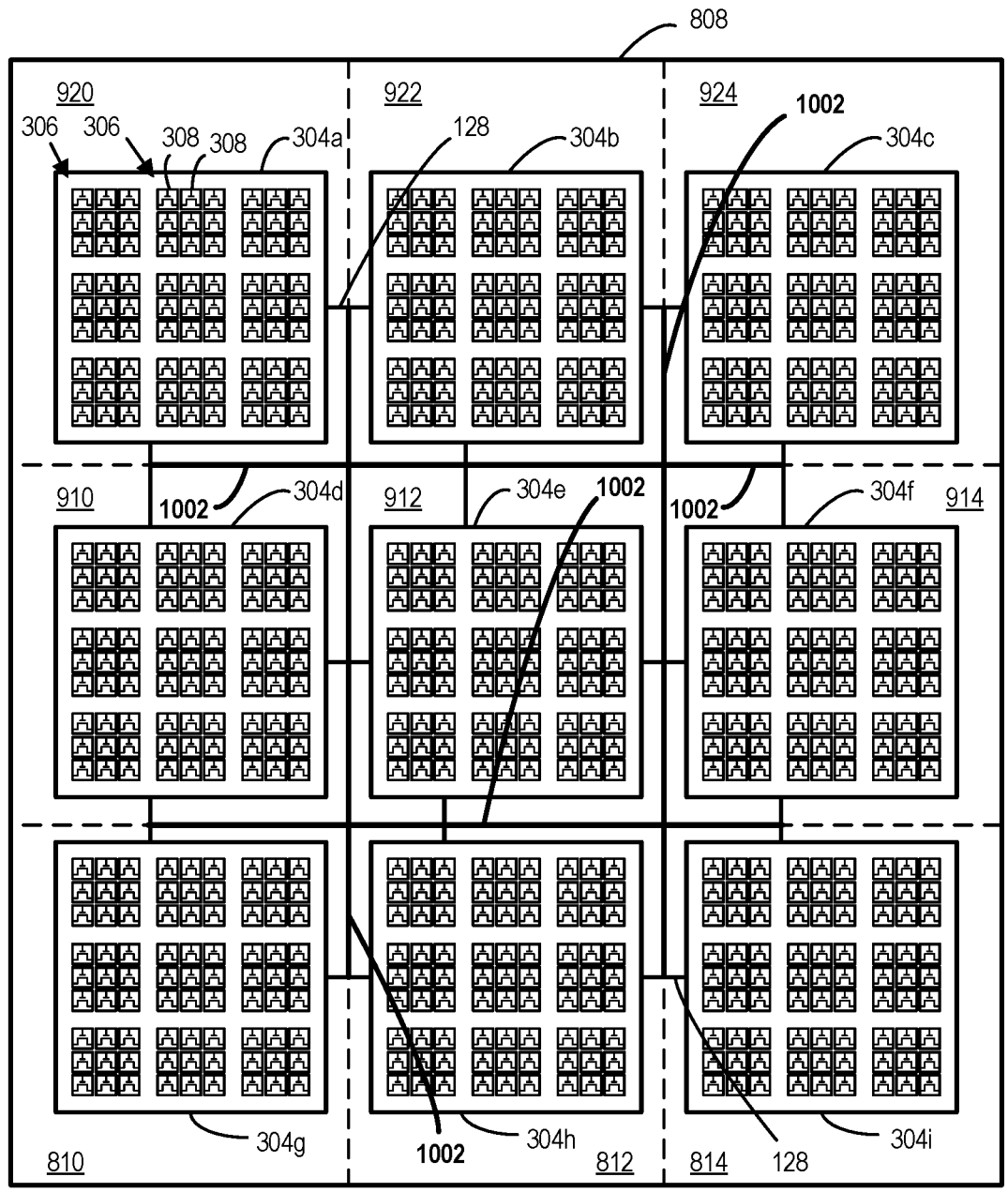
FIG. 10 illustrates a top view of an example volatile memory die having multiple volatile memory partitions and configurable routes in accordance with some embodiments of the present disclosure.
Figure 11:
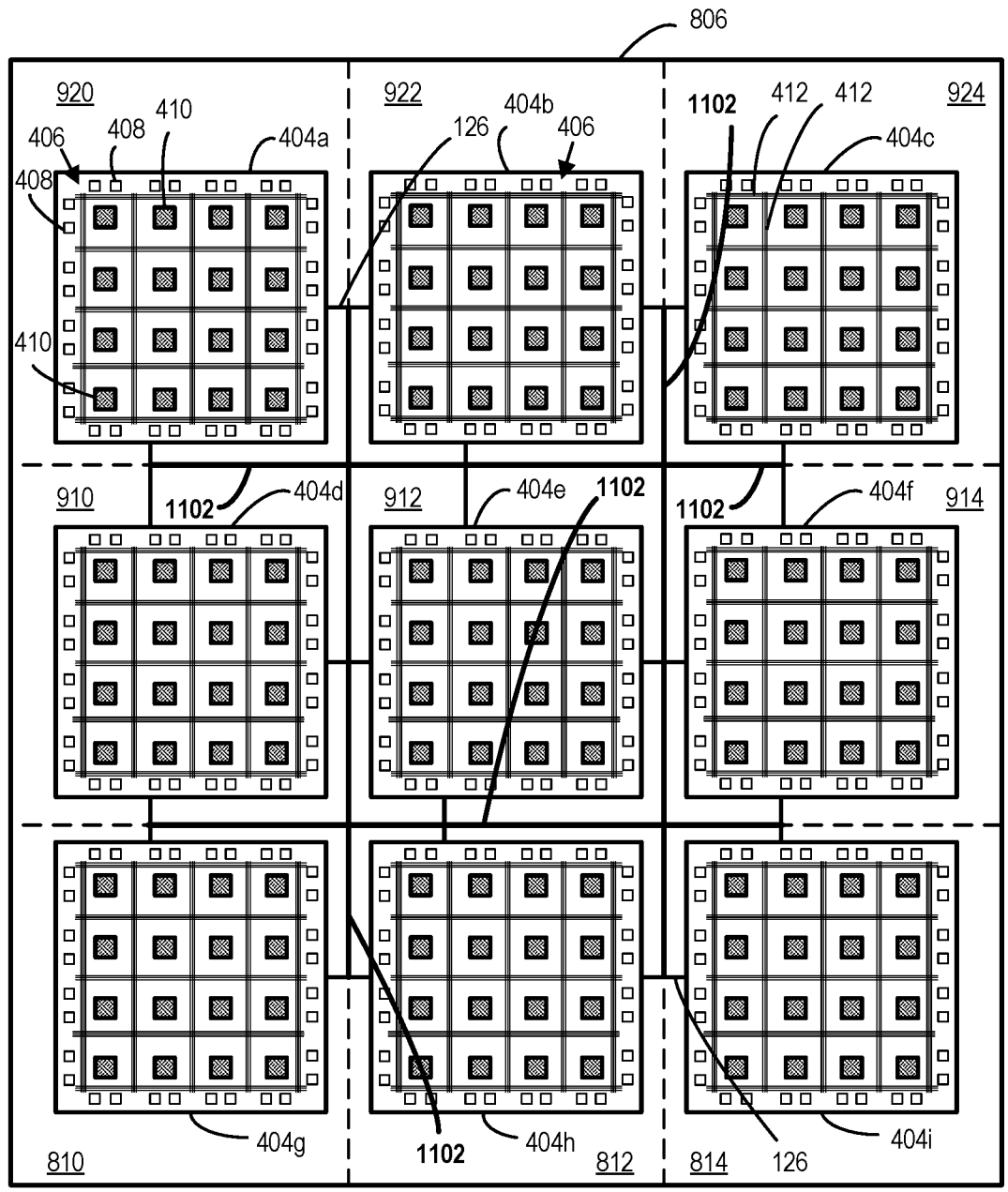
FIG. 11 illustrates a top view of an example processing logic die having multiple processing logic partitions and configurable routes in accordance with some embodiments of the present disclosure.

It is to be understood that the 3D SIC 800 has similar parts of the 3D SIC 100 of FIG. 1, except for the addition of configurable routes for failure management made up of at least TSVs 116, 816, 118, 818, 120, and 820, interconnects 122, 124, 126, and 128, and additional interconnects 902, 1002, and 1102 illustrated in FIGS. 9-11 respectively. These TSVs, interconnects, and additional interconnects make up a vast network of configurable routes within the 3D SIC 800.

Thus, the functional blocks of the 3D SIC 800 have a slightly different physical structure from the functional blocks of the 3D SIC 100. With that said, it is to be understood that the memory dies of 3D SIC 100 and 3D SIC 800 are somewhat similar except for the additional configurable routes of 3D SIC 800 (e.g., see additional interconnects 902 and 1002 depicted in FIGS. 9 and 10, respectively) and the logic dies of both 3D SICs are also somewhat similar except for the additional configurable routes of 3D SIC 800 (e.g., see additional interconnects 1101 depicted in FIG. 11). Each TSV of the TSVs of both 3D SICs 100 and 800 can be similar in structure, composition, and function. Each interconnect of the interconnects of both 3D SICs 100 and 800 can be similar in structure, composition, and function.

As mentioned, the 3D SIC 800 includes non-volatile memory dies 802 and 804. Other embodiments can include one non-volatile memory die or more than two non-volatile memory dies. A non-volatile memory die of embodiments can be a 3DXP die or include other types of non-volatile memory such as described herein. In some embodiments, a non-volatile memory die can include an array of non-volatile memory partitions (e.g., see the non-volatile memory partitions of FIG. 9). The 3D SIC 800 also includes the volatile memory die 808. Other embodiments can include more than one volatile memory die. A volatile memory die of embodiments can be a DRAM die or include other types of volatile memory such as described herein. In some embodiments, a volatile memory die can include an array of volatile memory partitions (e.g., see the volatile memory partitions of FIG. 10). The 3D SIC 800 also includes a processing logic die 806. Other embodiments can include more than one processing logic die. In some embodiments, the processing logic die 806 can include an array of processing logic partitions. Each partition of an array of partitions of the processing logic die 806 can be a separate FPGA, such as shown by the processing logic die in FIG. 11.

Also, similar to some other embodiments described herein, the 3D SIC 800 includes TSVs 116, 118, and 120 that interconnect the non-volatile memory dies 102 and 104, the volatile memory die 108, and the processing logic die 106. Also, 3D SIC 800 additionally includes TSVs 816, 818, and 820. TSVs 116 and 816 are shown in between and connecting the non-volatile memory die 802 to the non-volatile memory die 804. TSVs 118 and 818 are shown in between and connecting the non-volatile memory die 804 to the processing logic die 806. TSVs 120 and 820 are shown in between and connecting the processing logic die 806 to the volatile memory die 808. It is to be understood that all the TSVs described herein pass through the dies described herein even thought this may not be clear from the drawings. For example, TSVs 116, 118, 120, 816, 818, and 820 are parts of single TSVs passing through the dies of the 3D SIC 100 wherein each of the single TSVs passing through the dies are perpendicular to the dies. For instance, TSVs 116, 118, and 120 in functional block 810 are a single TSV passing through each die of 3D SIC 800.

As shown in FIG. 8, some embodiments 3D SIC can include a non-volatile memory die (such as a 3DXP die), a volatile memory die (such as a DRAM die), and a logic die. Also, as shown, the non-volatile memory die, the volatile memory die, and the logic die can be stacked and the 3D SIC can be partitioned into a plurality of columns that are perpendicular to each of the stacked dies (e.g., see the functional blocks 810, 812, and 814). Each column of the plurality of columns can be configurable to be bypassed via configurable routes, and the configurable routes can be configured to re-route functionality of a failing part of the column (e.g., see functional block 810) to a corresponding effective part of a neighboring column (e.g., see functional block 812). Example parts of configurable routes shown in the drawings include TSVs 116, 816, 118, 818, 120, and 820, interconnects 122, 124, 126, and 128, and additional interconnects 902, 1002, and 1102 illustrated in FIGS. 9-11 respectively. Neighboring columns (e.g., see functional blocks 810 and 812) can be columns positioned next to each other without an intermediate column between the neighboring columns. The neighboring column with the effective part can be a spare column reserved to receive re-routed functionality from one or more other columns.

Logic circuitry in the 3D SIC can be configured to reserve the neighboring column with the effective part as the spare column when the logic circuitry or different circuitry in the 3D SIC determines that the neighboring column with the effective part is partially failing. Alternatively, the logic circuitry can be configured to reserve the neighboring column with the effective part as the spare column without the determination that the neighboring column with the effective part is partially failing. Also, the logic circuitry can be configured to reserve a non-neighboring column with an effective part corresponding to the failing part. And, alternatively, circuitry external to the 3D SIC can be configured with similar functionality as the logic circuitry in the 3D SIC to reserve a column in the 3D SIC having an effective part corresponding to the failing part. The external circuitry can be configured to perform such a function when it determines that the column with the effective part is partially failing or without such a determination.

In some embodiments, the configurable routes can be configured to re-route the functionality of the failing part to the effective part in response to an error detecting logic circuit determining that the failing part is failing. The error detecting logic circuit can be a part of the 3D SIC or external to the 3D SIC. For example, the error detecting logic circuit can be a part of the logic circuitry in the 3D SIC. In some embodiments, the error detecting logic circuit and/or the logic circuitry can be a part of the logic die (such as be a part of the processing logic die 806 of 3D SIC 800).

The error detecting logic circuit can be configured to determine that the failing part is failing when a communication does not travel through a signal route of the failing part. This can be at least partially implemented by a simple circuit such as one including a switch and/or a sensor. The error detecting logic circuit can use any known error-correcting code memory technology (ECC memory technology), which is a computer data storage feature that can detect and correct many forms of internal data corruption in a memory circuit or a logic circuit. The error detecting logic circuit can be configured to determine that the failing part is failing when a communication does not travel through a signal route of the failing part by using ECC memory technology. For example, error detecting logic circuit can be configured to determine that the failing part is failing when a communication does not travel through a signal route of the failing part by using error detection codes or error correcting codes, such as a parity code (e.g., parity bit) or a Hamming code.

As shown in FIG. 8, each column can include a TSV that connects a non-volatile memory die, a volatile memory die, and a logic die in the 3D SIC, and the error detecting logic circuit can be configured to determine that the failing part is failing when a communication does not travel through a failing TSV of the 3D SIC. The configurable routes can be configured to re-route a communication initially directed to the failing TSV to a corresponding TSV of the neighboring column or a non-neighboring column, in response to the determination that the failing part is failing. Rerouting of a signal is usually faster when the signal is rerouted via a neighboring column; however, sometimes a replacement TSV may not be available at a neighboring column. In such cases, the configurable routes can re-route a communication initially directed to the failing TSV to a corresponding TSV of a non-neighboring column. Thus, in most embodiments, the configurable routes initially attempt to re-route a communication via a neighboring column, and if such rerouting fails then the configurable routes re-route the communication via a non-neighboring column.

FIG. 9 illustrates a top view of non-volatile memory die 802 having multiple non-volatile memory partitions 204a, 204b, 204c, 204d, 204e, 204f, 204g, 204h, and 204i and configurable routes in accordance with some embodiments of the present disclosure. FIG. 9 also shows respective non-volatile memory partitions of each functional block of the 3D SIC 800, i.e., functional blocks 810, 812, 814, 910, 912, 914, 920, 922, and 924. The configurable routes in the non-volatile memory die 802 shown in FIG. 9 include interconnects 122 and additional interconnects 902. FIG. 9 also depicts the parts of each non-volatile memory partition, including non-volatile memory element clusters 206, non-volatile memory elements 208 of each cluster, and cross point 209 of each non-volatile memory element.

In some embodiments, the non-volatile memory die can be a 3DXP die, which uses transistor-less memory elements, each of which has a memory cell and a corresponding address (as well as an optional selector and the cell and optional selector can be stacked together as a column). In examples with memory elements, the memory elements can be connected via two perpendicular layers of interconnects (as shown but not labeled in FIG. 9), where one layer is above the memory elements and the other layer is below the memory elements. Each memory element can be individually selected at a cross point of one wire on each of the two layers of interconnects (e.g., see cross point 209 shown in FIG. 9).

Each cross point of a 3DXP die can have an address or is addressable or selectable such as by an address decoder of the 3DXP die, the 3D IC, or a group of ICs of the 3D IC. Routes to each cross point can be re-routed by at least the address decoder interacting with additional interconnects in or near the 3DXP die. Also, routes to each cross point can be re-routed by the error detecting logic circuit interacting with at least the address decoder and the additional interconnects.

In general, each non-volatile memory cell of the non-volatile memory die 802 has an address or is addressable or selectable such as by an address decoder of the non-volatile memory die or external to the die but in the 3D SIC. Also, routes to each non-volatile memory cell can be re-routed by at least the address decoder interacting with the additional interconnects 902 depicted in FIG. 9. Also, routes to each non-volatile memory cell can be re-routed by the error detecting logic circuit interacting with at least the address decoder and the additional interconnects 902.

FIG. 10 illustrates a top view of volatile memory die 808 having multiple volatile memory partitions 304a, 304b, 304c, 304d, 304e, 304f, 304g, 304h, and 304i and configurable routes in accordance with some embodiments of the present disclosure. FIG. 10 also shows respective volatile memory layers of each functional block of the 3D SIC 800, i.e., functional blocks 810, 812, 814, 910, 912, 914, 920, 922, and 924. The configurable routes in the volatile memory die 808 shown in FIG. 10 include interconnects 128 and additional interconnects 1002. FIG. 10 also depicts the parts of each volatile memory partition, including volatile memory element clusters 306 and volatile memory elements 308 of each cluster. In some embodiments, the volatile memory die can be a DRAM die. Routes to each memory element 308 or cluster 306 or partition of the volatile memory die can be re-routed by an address decoder in the volatile memory die 808 or external to the die but in the 3D SIC. For example, routes to each memory element 308 or cluster 306 or partition of the volatile memory die can be re-routed by at least the address decoder interacting with the additional interconnects 1002 depicted in FIG. 10. Also, routes to each memory element 308 or cluster 306 or partition of the volatile memory die can be re-routed by the error detecting logic circuit interacting with at least the address decoder and the additional interconnects 1002.

Referring back to FIG. 9, as shown, each column can include a non-volatile memory partition of a non-volatile memory die (e.g., see non-volatile memory partitions 204a, 204b, 204c, 204d, 204e, 204f, 204g, 204h, and 204i) and the non-volatile memory partitions can include a plurality of non-volatile memory cells. Each cell can include two intersecting interconnects. The error detecting logic circuit can be configured to determine that the failing part is failing when a communication does not travel through a failing interconnect of the two interconnects. And, the configurable routes can be configured to re-route a communication initially directed to the failing interconnect of the two interconnects of the cell to a corresponding effective non-volatile memory cell of a neighboring column or a neighboring cluster of cells within the column, in response to the determination that the failing part is failing. Rerouting of a signal is usually faster when the signal is rerouted via a neighboring column or cluster; however, sometimes a replacement cell may not be available at a neighboring column or cluster. In such cases, the configurable routes can re-route a communication initially directed to the failing cell to a corresponding cell of a non-neighboring column or cluster. Thus, in most embodiments, the configurable routes initially attempt to re-route a communication via a neighboring column or cluster, and if such rerouting fails then the configurable routes re-route the communication via a non-neighboring column or cluster. In these examples, the non-volatile memory partitions can be 3DXP partitions.

Also, as shown in FIG. 9, a plurality of interconnects can connect each non-volatile memory partition to its neighboring partitions and such partitions can be 3DXP partitions. In such examples, the error detecting logic circuit can be configured to determine that the failing part is failing when a communication does not travel through a failing interconnect of the plurality of interconnects. The configurable routes can be configured to re-route a communication initially directed to the failing interconnect of the plurality of interconnects to a corresponding effective non-volatile memory partition of the neighboring column, in response to the determination that the failing part is failing. Rerouting of a signal is usually faster when the signal is rerouted via a neighboring column; however, sometimes a replacement interconnect may not be available at a neighboring column. In such cases, the configurable routes can re-route a communication initially directed to the failing interconnect to a corresponding interconnect of a non-neighboring column. Thus, in most embodiments, the configurable routes initially attempt to re-route a communication via a neighboring column, and if such rerouting fails then the configurable routes re-route the communication via a non-neighboring column.

The error detecting logic circuit can be configured to determine that the failing part is failing when a retrieved result (such as a retrieved calculated result) is unexpected at the failing part. This can be at least partially implemented by a simple circuit such as one including a switch and/or a sensor. The error detecting logic circuit can use any known ECC memory technology, which is a computer data storage feature that can detect and correct many forms of internal data corruption in a memory circuit or a logic circuit. The error detecting logic circuit can be configured to determine that the failing part is failing when a retrieved result is unexpected at the failing part by using ECC memory technology. For example, error detecting logic circuit can be configured to determine that the failing part is failing when a retrieved result is unexpected at the failing part by using error detection codes or error correcting codes, such as a parity code (e.g., parity bit) or a Hamming code.

Not shown in the drawings, a memory cell in one of the volatile or non-volatile memory partitions in the 3D SIC can include a retrievable result, and the error detecting logic circuit can be configured to determine that the failing part is failing when a retrieved result is unexpected at a failing memory cell. For example, each cell of a 3DXP partition can include a retrievable result, and the error detecting logic circuit can be configured to determine that the failing part is failing when a retrieved result is unexpected at a failing cell of a 3DXP partition. The configurable routes can be configured to re-route data storage of data directed to the failing cell to a corresponding effective volatile or non-volatile memory cell of the neighboring column, in response to the determination that the failing part is failing. Rerouting storage to a cell is usually faster when the storage is rerouted via a neighboring column; however, sometimes a corresponding cell may not be available at a neighboring column. In such cases, the configurable routes can re-route data storage initially directed to the failing cell to a corresponding cell of a non-neighboring column. Thus, in most embodiments, the configurable routes initially attempt to re-route data storage via a neighboring column, and if such rerouting fails then the configurable routes re-route the storage via a non-neighboring column.

FIG. 11 illustrates a top view of processing logic die 806 having multiple processing logic partitions 404a, 404b, 404c, 404d, 404e, 404f, 404g, 404h, and 404i and configurable routes in accordance with some embodiments of the present disclosure. FIG. 11 also shows respective partitions of each functional block of the 3D SIC 800, i.e., functional blocks 810, 812, 814, 910, 912, 914, 920, 922, and 924. The configurable routes in the processing logic die 806 shown in FIG. 11 include interconnects 126 and additional interconnects 1102. FIG. 11 also depicts the parts of each logic partition, including FPGAs 406, input/output blocks 408, logic blocks 410, and programmable or non-programmable interconnects 412. In general, each partition of the processing logic die can include an FPGA or another type of processing logic device. The processing logic die also can include a controller unit and an arithmetic/logic unit. For instance, the arithmetic/logic unit can include an FPGA.

Routes to each FPGA, input/output block, logic block, and/or partition of the logic die can be re-routed by an address decoder in the processing logic die 806 or external to the die but in the 3D SIC. For example, routes to each FPGA, input/output block, logic block, and/or partition of the processing logic die can be re-routed by at least the address decoder interacting with the additional interconnects 1102 depicted in FIG. 11. Also, routes to each FPGA, input/output block, logic block, and/or partition of the processing logic die can be re-routed by the error detecting logic circuit interacting with at least the address decoder and the additional interconnects 1102.

The error detecting logic circuit can be configured to determine that the failing part is failing when a retrieved calculated result from a logic part or a memory cell is unexpected at the failing part. This can be at least partially implemented by a simple circuit such as one including a switch and/or a sensor. The error detecting logic circuit can use any known ECC memory technology. The error detecting logic circuit can be configured to determine that the failing part is failing when a retrieved calculated result from a logic part or a memory cell is unexpected at the failing part by using ECC memory technology. For example, error detecting logic circuit can be configured to determine that the failing part is failing when a retrieved calculated result from a logic part or a memory cell is unexpected at the failing part by using error detection codes or error correcting codes, such as a parity code (e.g., parity bit) or a Hamming code.

As shown in FIG. 11, each column can include a logic partition of the logic die, and each logic partition can include a retrievable calculated result. And, the error detecting logic circuit can be configured to determine that the failing part is failing when a retrieved calculated result is unexpected at a failing logic partition of the logic die. The configurable routes can be configured to re-route a data processing request directed to the failing logic partition to a corresponding effective logic partition of a neighboring column, in response to the determination that the failing part is failing. Rerouting data processing is usually faster when the processing is rerouted via a neighboring column; however, sometimes a corresponding logic unit may not be available at a neighboring column. In such cases, the configurable routes can re-route processing initially directed to the failing logic unit to a corresponding unit of a non-neighboring column. Thus, in most embodiments, the configurable routes initially attempt to re-route data processing via a neighboring column, and if such rerouting fails then the configurable routes re-route the processing via a non-neighboring column.

Relevant to at least FIGS. 8-11, in some embodiments, a 3D SIC includes a non-volatile memory die, a volatile memory die, and a logic die, and, the non-volatile memory die, the volatile memory die, and the logic die are stacked. In such embodiments, the 3D SIC is partitioned into a plurality of columns that are perpendicular to each of the stacked dies, and each column of the plurality of columns is configurable to be bypassed via configurable routes. And, the configurable routes can be configured to re-route functionality of the column to a corresponding part of a neighboring column based at least in part on a quantity of bit errors in the column exceeding a threshold.

In such embodiments, the neighboring column can be positioned next the column without an intermediate column between the neighboring column and the column. Also, the neighboring column can be a spare column configured to receive re-routed functionality from one or more other columns including the column. Also, the logic circuitry in the 3D SIC can be configured to reserve the neighboring column as the spare column when an error detecting logic circuit determines that a quantity of bit errors in the column exceeds a threshold.

Further, the configurable routes can be configured to re-route the functionality of the column to the neighboring column in response to an error detecting logic circuit in the 3D SIC determining that a quantity of bit errors in the column exceeds a threshold.

Also, the configurable routes can be configured to re-route the functionality of the column to the neighboring column when a communication does not travel through a signal route of the column. Each column can include a TSV that connects the non-volatile memory die, the volatile memory die, and the logic die, and the configurable routes can be configured to re-route the functionality of the column to the neighboring column when a communication does not travel through the TSV of the column. Also, the configurable routes can be configured to re-route a communication to a TSV of the neighboring column, when the communication does not travel through the TSV of the column.

Further, each column can include a 3DXP partition of the non-volatile memory die and the 3DXP partition can include a plurality of non-volatile memory cells, and each cell can include two intersecting interconnects. And, the configurable routes can be configured to re-route a communication initially directed to an interconnect of two interconnects of a cell of the column to a corresponding cell of the neighboring column, when the communication does not travel through the interconnect of the cell of the column. Also, the non-volatile memory die can have a plurality of 3DXP partitions and a plurality of interconnects connecting each 3DXP partition to its neighboring partitions, and the configurable routes can be configured to re-route a communication initially directed to an interconnect of the plurality of interconnects to a corresponding 3DXP partition of a neighboring column, when the communication does not travel through the interconnect.

Also, in some embodiments, the configurable routes can be configured to re-route the functionality of the column to the neighboring column in response to an error detecting logic circuit in the 3D SIC determining a retrieved result is unexpected at the column. Again, each column can include a 3DXP partition of the non-volatile memory die and the 3DXP partition can include a plurality of non-volatile memory cells. Each cell can include a retrievable result, and the configurable routes can be configured to re-route storage of data directed to a non-volatile memory cell of the column to a corresponding non-volatile memory cell of the neighboring column, in response to the error detecting logic circuit determining a retrieved result is unexpected at the column.

Also, in some embodiments, the configurable routes can be configured to re-route the functionality of the column to the neighboring column in response to an error detecting logic circuit in the 3D SIC determining a retrieved calculated result is unexpected at the column. Each column can include a logic partition of the logic die, and each logic partition can include a retrievable calculated result. In such examples, the configurable routes can be configured to re-route a data processing request directed to a logic partition of the column to a corresponding logic partition of the neighboring column, in response to the error detecting logic circuit determining a retrieved calculated result is unexpected at the column.

Also, relevant to at least FIGS. 8-11, in some embodiments, a 3D SIC includes 3DXP memory die, DRAM die, and a logic die, and the 3DXP memory die, the DRAM memory die, and the logic die are stacked, the 3D SIC is partitioned into a plurality of columns that are perpendicular to each of the stacked dies, and each column of the plurality of columns is configurable to be bypassed via configurable routes. In such embodiments and more general embodiments, the configurable routes are configured to re-route functionality of a part of the column to a corresponding part of a neighboring column. Also, in such embodiments and more general embodiments, the configurable routes can be configured to re-route the functionality of the part of the column to the corresponding part of the neighboring column in response to an error detecting logic circuit in the 3D SIC determining that the part of the column is failing. And, the error detecting logic circuit can be configured to determine that the part of the column is failing when a communication does not travel through a signal route of the part of the column. Also, the error detecting logic circuit can be configured to determine that the part of the column is failing when a retrieved result is unexpected at the part of the column. And, the error detecting logic circuit can be configured to determine that the part of the column is failing based at least in part on a quantity of bit errors in the column exceeding a threshold.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An integrated circuit device, comprising:
a plurality of integrated circuit dies configured in a stack, wherein memory cells and logic circuits are formed on the plurality of integrated circuit dies, wherein the stack is partitioned into a plurality of columns that are perpendicular to the plurality of integrated circuit dies; and
routes configurable to bypass at least a part of a respective column in the plurality of columns and re-route functionality of the respective column to at least a part of a different column of the plurality of columns.

2. The integrated circuit device of claim 1, wherein the re-route of the functionality of the respective column to the at least the part of the different column is based at least in part on a bit error rate of the respective column.

3. The integrated circuit device of claim 1, wherein the different column is positioned adjacent to the respective column.

4. The integrated circuit device of claim 3, wherein positioned adjacent comprises the respective column having no intermediate column between the different column and the respective column.

5. The integrated circuit device of claim 1, wherein the routes are configurable to re-route the functionality of the respective column to the different column in response to a determination that a communication fails to go through the respective column.

6. The integrated circuit device of claim 1, wherein the different column is a spare column configured to receive re-routed functionality from one or more other columns including the respective column.

7. The integrated circuit device of claim 6, wherein the respective column comprises a partition having a computing logic circuit.

8. The integrated circuit device of claim 6, wherein the respective column comprises through silicon vias connecting portions of the plurality of integrated circuit dies in the respective column.

9. The integrated circuit device of claim 6, wherein the respective column comprises a partition having a computing logic circuit, and wherein the routes are configurable to re-route the functionality of the computing logic circuit in the respective column to the different column.

10. The integrated circuit device of claim 1, wherein the respective column comprises a partition having volatile memory cells.

11. The integrated circuit device of claim 10, wherein the routes are configurable to re-route the functionality of the volatile memory cells in the respective column to the different column.

12. An integrated circuit, comprising:
a plurality of integrated circuit dies configured in a three-dimensional stack, wherein memory cells are formed on at least a first one of the plurality of integrated circuit dies, and logic circuits are formed on at least a second one of the plurality of integrated circuit dies, wherein the three-dimensional stack is configured into a plurality of columns, wherein at least one of the plurality of columns comprises a memory cell and a logic circuit; and
routes configurable to bypass at least a part of a respective column in the plurality of columns and re-route functionality.

13. The integrated circuit of claim 12, wherein the re-route of the functionality of the respective column to a corresponding part of a neighboring column based at least in part on a bit error rate.

14. The integrated circuit of claim 13, wherein the neighboring column is positioned next to the respective column.

15. The integrated circuit of claim 14, wherein positioned next to comprises the respective column having no intermediate column between the neighboring column and the respective column.

16. The integrated circuit of claim 13, wherein the routes are configurable to re-route the functionality of the respective column to the neighboring column in response to a determination that a communication fails to go through the respective column.

17. The integrated circuit of claim 13, wherein the neighboring column is a spare column configured to receive re-routed functionality from one or more other columns including the respective column.

18. The integrated circuit of claim 13, wherein the respective column comprises a partition having volatile memory cells.

19. The integrated circuit of claim 18, wherein the routes are configurable to re-route the functionality of the volatile memory cells in the respective column to the neighboring column.

20. The integrated circuit of claim 18, wherein the respective column comprises a partition having a computing logic circuit, and wherein the respective column comprises through silicon vias connecting portions of the plurality of integrated circuit dies in the respective column.

21. An integrated circuit, comprising:
a three-dimensional stack of integrated circuit dies, wherein a memory cell is formed on a first integrated circuit die of the three-dimensional stack of integrated circuit dies, and wherein a logic circuit is formed on a second integrated circuit die of the three-dimensional stack of integrated circuit dies, wherein the three-dimensional stack comprises one or more columns, wherein at least one column of the one or more columns comprises the memory cell and the logic circuit; and
routes configurable to bypass at least a part of a respective column in the one or more columns by a re-route functionality.

22. The integrated circuit of claim 21, wherein the re-route functionality of the at least one column to a corresponding part of a neighboring column based on an error rate.

23. The integrated circuit of claim 22, wherein the neighboring column is positioned next to the respective column.

24. The integrated circuit of claim 23, wherein positioned next to comprises the respective column having no intermediate column between the neighboring column and the respective column.

25. The integrated circuit of claim 22, wherein the routes are configurable to re-route the functionality of the respective column to the neighboring column in response to a determination that a communication fails to go through the respective column.

26. The integrated circuit of claim 22, wherein the neighboring column is a spare column configured to receive re-routed functionality from one or more other columns including the respective column.

27. The integrated circuit of claim 22, wherein the respective column comprises a partition having volatile memory cells.

28. The integrated circuit of claim 27, wherein the routes are configurable to re-route the functionality of the volatile memory cells in the respective column to the neighboring column.

29. The integrated circuit of claim 27, wherein the respective column comprises a partition having a computing logic circuit, and wherein the respective column comprises through silicon vias connecting portions of one or more circuit dies in the respective column.

\* \* \* \* \*